United States Patent [19]

Shepter

[11] Patent Number: 4,517,474
[45] Date of Patent: May 14, 1985

[54] LOGIC CIRCUIT BUILDING BLOCK AND SYSTEMS CONSTRUCTED FROM SAME

[75] Inventor: Joseph J. Shepter, New Haven, Conn.

[73] Assignee: Scientific Circuitry, Inc., Norwalk, Conn.

[21] Appl. No.: 572,390

[22] Filed: Jan. 20, 1984

Related U.S. Application Data

[62] Division of Ser. No. 235,635, Feb. 18, 1981, Pat. No. 4,438,350, which is a division of Ser. No. 852,594, Nov. 17, 1977, Pat. No. 4,257,088, which is a division of Ser. No. 382,891, Jul. 26, 1973, abandoned.

[51] Int. Cl.$^3$ ............................................. H03K 23/04
[52] U.S. Cl. ................................ 307/272 R; 307/440; 328/205; 377/54; 377/119
[58] Field of Search ............... 307/289, 291, 440, 445, 307/465, 518, 231, 272 R; 377/54, 64, 67, 119; 328/191, 193, 205

[56] References Cited

U.S. PATENT DOCUMENTS 3,778,794 12/1973 Szabo et al. .................... 307/234

Primary Examiner—Stanley D. Miller
Attorney, Agent, or Firm—Kenyon & Kenyon

[57] ABSTRACT

A logic system which includes a plurality of identical logic circuit building blocks, each referred to as an M Circuit, is disclosed. The M Circuits are connected in a linear array of interconnected M Circuits including first through last M Circuits, the linear array providing a latch operation. The system comprises a plurality of M Circuits each of which responds to transitions of a two-level binary input signal to provide a memory and a logic function which has a complete truth table for every possible combination of input signal transitions or changes in logic level at a pair of input terminals A and B. Each of the M Circuits comprises a gate having two inputs connected to the A and B input terminals, respectively, and a set-reset flip flop having its set input connected to the output of the gate, the reset input connected to the B input terminal and the set and reset outputs connected, respectively, to the output terminals Q and $\overline{Q}$ of the M Circuit. The Q and $\overline{Q}$ output terminals provide complementary binary outputs for any combination of binary inputs applied at the A and B input terminals, whereby the M Circuit is a four terminal device which responds to each transition of the input signal at the A and B terminals to provide outputs at the Q and $\overline{Q}$ terminals in accordance with the truth table function. One of the output terminals of each of the first through next to last M Circuits are connected to the B input terminal of the succeeding M Circuit. The A input terminals of the M Circuits are coupled together, the A input terminals being coupled to a source of an input signal. One of the output terminals of the last M Circuit is connected as a reset line to the B input terminal of the first M Circuit, whereby one of the output terminals of the first M Circuit may be provided as a latch output line for operating an output device in response to the input signal.

3 Claims, 85 Drawing Figures

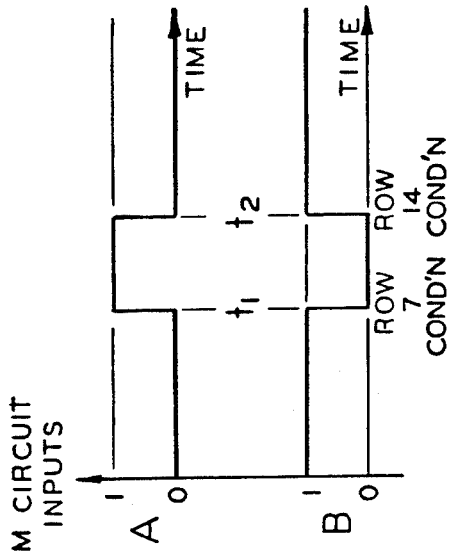
FIG. 8A
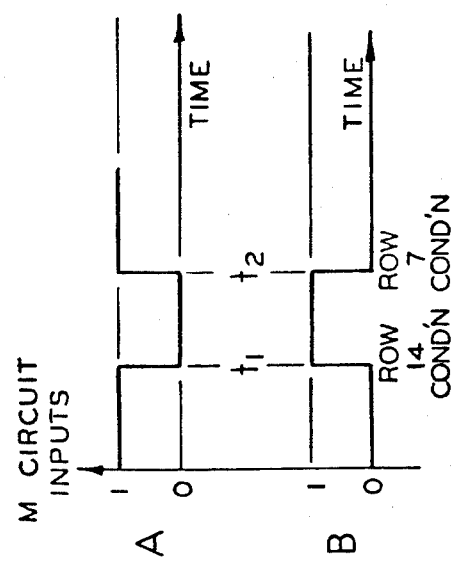
FIG. 8B
FIG. 3A
[PRIOR ART THEORY]

TRUTH TABLE FOR THE NOR GATE
SET-RESET FLIP-FLOP

| ROWS | $S_0$ | $R_0$ | $Q_0$ | $\bar{Q}_0$ | S | R | Q | $\bar{Q}$ |
|---|---|---|---|---|---|---|---|---|
| 1 | 0 | 0 | 0 | 1 | 0 | 0 | 0 | 1 |
| 2 | 0 | 0 | 0 | 1 | 0 | 1 | 1 | 0 |
| 3 | 0 | 0 | 0 | 1 | 1 | 0 | 0 | 1 |
| 4 | 0 | 0 | 0 | 1 | 1 | 1 | 0 | 0 |
| 5 | 0 | 0 | 1 | 0 | 0 | 0 | 1 | 0 |
| 6 | 0 | 0 | 1 | 0 | 0 | 1 | 1 | 0 |
| 7 | 0 | 0 | 1 | 0 | 1 | 0 | 0 | 1 |
| 8 | 0 | 0 | 1 | 0 | 1 | 1 | 0 | 0 |
| 9 | 0 | 1 | 1 | 0 | 0 | 0 | 1 | 0 |
| 10 | 0 | 1 | 1 | 0 | 0 | 1 | 1 | 0 |
| 11 | 0 | 1 | 1 | 0 | 1 | 0 | 0 | 1 |
| 12 | 0 | 1 | 1 | 0 | 1 | 1 | 0 | 0 |
| 13 | 1 | 0 | 0 | 1 | 0 | 0 | 0 | 1 |
| 14 | 1 | 0 | 0 | 1 | 0 | 1 | 1 | 0 |
| 15 | 1 | 0 | 0 | 1 | 1 | 0 | 0 | 1 |
| 16 | 1 | 0 | 0 | 1 | 1 | 1 | 0 | 0 |
| 17 | 1 | 1 | 0 | 0 | 0 | 0 | 1/0 | 0/1 |
| 18 | 1 | 1 | 0 | 0 | 0 | 1 | 1 | 0 |
| 19 | 1 | 1 | 0 | 0 | 1 | 0 | 0 | 1 |
| 20 | 1 | 1 | 0 | 0 | 1 | 1 | 0 | 0 |

FIG. 5

[PRIOR ART]

TRUTH TABLE FOR THE M CIRCUIT IN NOR GATE FORM

| ROWS | $A_0$ | $B_0$ | $Q_0$ | $\bar{Q}_0$ | A | B | Q | $\bar{Q}$ |
|---|---|---|---|---|---|---|---|---|
| 1 | 0 | 0 | 0 | 1 | 0 | 0 | 0 | 1 |
| 2 | 0 | 0 | 0 | 1 | 0 | 1 | 1 | 0 |
| 3 | 0 | 0 | 0 | 1 | 1 | 0 | 0 | 1 |
| 4 | 0 | 0 | 0 | 1 | 1 | 1 | 1 | 0 |
| 5 | 0 | 1 | 1 | 0 | 0 | 0 | 0 | 1 |
| 6 | 0 | 1 | 1 | 0 | 0 | 1 | 1 | 0 |
| 7 | 0 | 1 | 1 | 0 | 1 | 0 | 1/0 | 0/1 |
| 8 | 0 | 1 | 1 | 0 | 1 | 1 | 1 | 0 |
| 9 | 1 | 0 | 0 | 1 | 0 | 0 | 0 | 1 |
| 10 | 1 | 0 | 0 | 1 | 0 | 1 | 1 | 0 |
| 11 | 1 | 0 | 0 | 1 | 1 | 0 | 0 | 1 |
| 12 | 1 | 0 | 0 | 1 | 1 | 1 | 1 | 0 |
| 13 | 1 | 0 | 1 | 0 | 0 | 0 | 0 | 1 |
| 14 | 1 | 0 | 1 | 0 | 0 | 1 | 1/0 | 0/1 |
| 15 | 1 | 0 | 1 | 0 | 1 | 0 | 1 | 0 |
| 16 | 1 | 0 | 1 | 0 | 1 | 1 | 1 | 0 |
| 17 | 1 | 1 | 1 | 0 | 0 | 0 | 0 | 1 |
| 18 | 1 | 1 | 1 | 0 | 0 | 1 | 1 | 0 |
| 19 | 1 | 1 | 1 | 0 | 1 | 0 | 1 | 0 |
| 20 | 1 | 1 | 1 | 0 | 1 | 1 | 1 | 0 |

FIG. 7A

SET

RESET

MEMORY

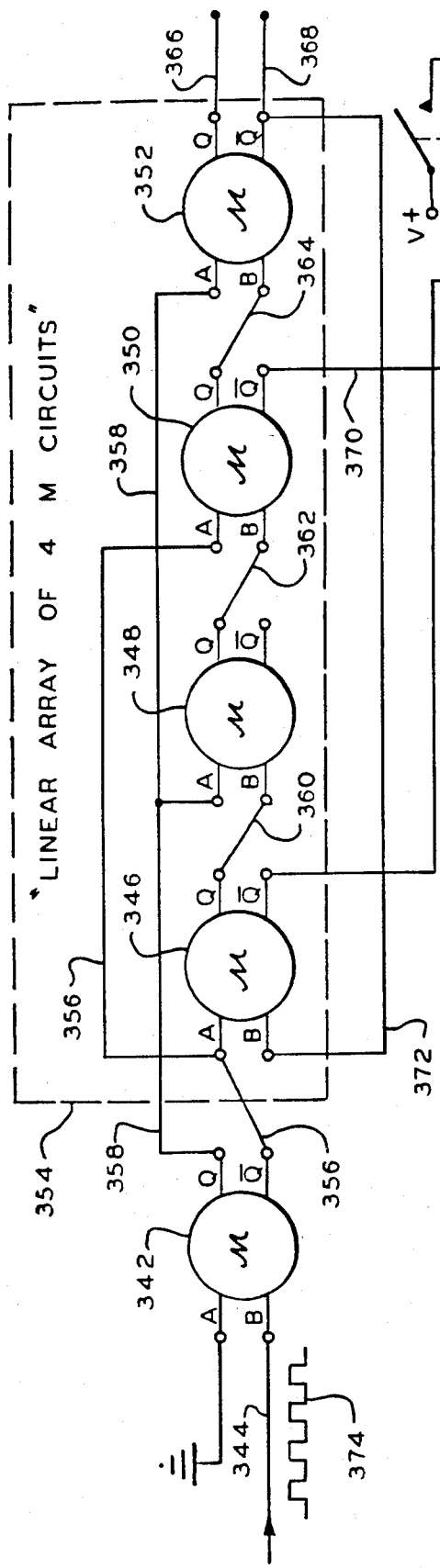
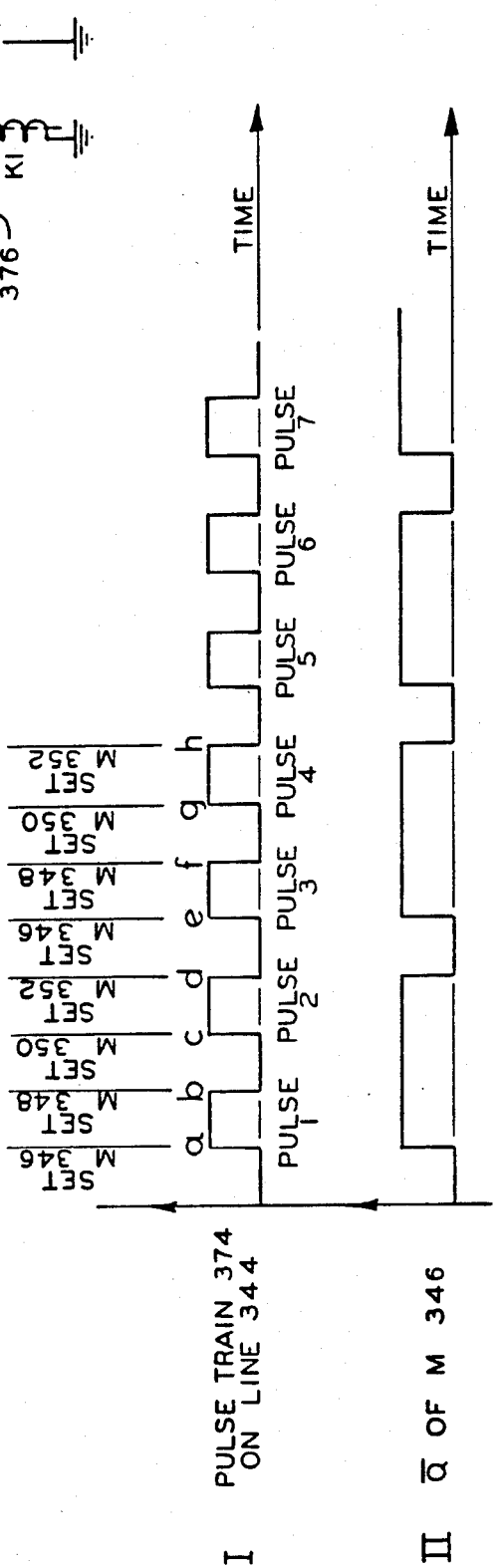
FIG. 20A
FIG. 20B

LOGIC CIRCUIT BUILDING BLOCK AND SYSTEMS CONSTRUCTED FROM SAME

This is a division of application Ser. No. 235,635 filed Feb. 18, 1981, now issued U.S. Pat. No. 4,438,350, which is a division of application Ser. No. 852,594 filed Nov. 17, 1977, now issued U.S. Pat. No. 4,257,008, which is in turn a division of application Ser. No. 382,891, filed July 26, 1973 now abandoned.

BACKGROUND OF THE INVENTION

The present invention generally relates to logic circuits, and more particularly to a logic circuit building block, herein termed an M Circuit, and the development of subsystems and systems with such M Circuit.

Various types of logic circuit building blocks have been developed by the electronic industry for use in designing systems which operate on two level binary data. One basic building block is the set-reset flip flop. The set-reset flip flop, however, is generally characterized by a truth table in which, for some conditions of data input and data change at the two inputs, the two outputs lose complementation and provide the logic fallacy of identical binary outputs. This is an undesirable condition if complementation is required by the system design. Another undesirable condition occurring in the set-reset flip flop is known as the indeterminate state wherein a particular data transition at the two inputs produce outputs which are unpredictable. Both of these conditions referred to above, that is, loss of complementation and the indeterminate state, arise because two inputs may be simultaneously applied to the set-reset flip flop which cause both of its outputs to be identical. Attempts to overcome these problems have involved the use of clocking, gate logic circuitry in conjunction with one or more set-reset flip flops. This makes the flip flop more complex and also requires, in large systems, clock generators of high power output. This is true since clocking is accomplished at each stage within the system. Similarly, system resetting can also require a large number of wire runs and a large drive capability since, generally, each flip flop or groups of flip flops within a system must be individually reset. The use of a clock also results in a certain slowing down of the system. That is, the maximum speed of operations within the system is affected by the clock rate. Normally, operations are performed on only either the leading or trailing edges of clock pulses. The result, very often, is that the logic elements in the system are not utilized to the fullest extent possible in regard to their inherent speed.

Some of these problems become particularly noticeable when it is desired to separate large quantities of data. If such data separation is attempted using set-reset flip flops, the designer runs into the problem of having a situation involving the loss of complementation at the flip flop output, as discussed above. In addition, the designer must provide a large number of individual resets to the flip flops in the data separation system. On the other hand, where a clock type of flip flop is employed, there must be supplied additional amounts of clock power to accommodate the added gates and flip flop stages.

Thus, it can be seen that there exists a need for a basic building block which can be used to design information generating and processing systems and avoid problems associated with clocking at each stage of data processing. In addition, it would improve the efficiency of such a system if it responded to both the leading and trailing edges of pulses and thereby not have to wait a full cycle to perform each sequential operation. Also, the basic building block employed should not have the inherent characteristics of the set-reset flip flop which permits the loss of complementation at the outputs, and an indeterminate state, but should have its simplicity of design. Furthermore, it would be desirable to have a building block which can easily be reset when combined with other such circuits.

SUMMARY OF THE INVENTION

It is an object of the present invention to provide a logic circuit building block which responds to transitions of a two level binary input signal and has a complete truth table function for every possible combination of input signal transitions or changes of logic level at a pair of input terminals.

It is another object to provide a logic circuit building block which provides a complete truth table function wherein the twenty possible input signal transitions at a pair of input terminals will produce twenty corresponding complementary output signals at a pair of output terminals, without the loss of complementation at the output terminals and without an indeterminate condition.

It is another object to provide a logic circuit building block wherein one of its input terminals is both a reset and an enable terminal so that the logic circuit building block can be reset or enabled to be set, respectively, at that one terminal.

It is another object to provide a logic circuit building block which is used as a basic element in subsystems and systems, without the need for associated clocking, gate logic circuitry.

It is another object to provide information processing systems formed with a plurality of logic circuit building blocks, each of which responds to transitions of two level binary input data and has a complete truth table function for every possible combination of input signal transitions or changes of logic level at a pair of input terminals.

It is a further object to provide information processing systems which respond to input signal transitions or changes in logic level without requiring separate clocking, gate logic circuitry.

These, and other objects, are achieved by the present invention which provides a logic circuit building block, referred to as an M Circuit, which solves various problems of prior art logic circuit building blocks and binary logic systems. The M Circuit responds to transitions of a two level binary input signal to provide a memory and a logic function which has a complete truth table for every possible combination of input signal transitions or changes in logic level at a pair of input terminals A and B. The M Circuit generally includes both logic gating and a memory for placing the M Circuit in a set condition in response to the application of first known combinations of input signal levels or transitions at the A and B terminals, and for placing the M Circuit in a reset condition in response to the application of second known combinations of input signal levels at the A and B input terminals. The M Circuit is placed in a memory condition whereby it memorizes its previous set or reset condition in response to the application of third known combinations of input signal levels at the A and B input terminals. A pair of output terminals Q and $\overline{Q}$ for the M Circuit provide a first known combination of complementary output signal levels when the M Circuit is in the set condition, and a second known combination of complementary output signal levels when the M Circuit is in the reset condition. Thus, the M Circuit provides predetermined complementary, binary output signals at the Q and $\overline{Q}$ terminals for every possible combination of input signal transitions at the A and B terminals in accordance with its truth table function, without requiring clocking, gate logic circuitry.

A preferred embodiment of the M Circuit is disclosed which includes a first gate having two inputs connected to the A and B input terminals, a second gate having one input connected to the output of the first gate, and a third gate having one input connected to the B input terminal, another input connected to the output of the second gate, and an output connected to another input of the second gate. The outputs of the second and third gates are respectively connected to the Q and $\overline{Q}$ output terminals, and the B input terminal is both a reset and an enable terminal so that the M Circuit can be reset or enabled to be set, respectively, at the B terminal. A further preferred form of this embodiment comprises three NOR gates constituting the first, second and third gates.

The single M Circuit may have its terminals connected in a manner which provides various subsystem operating characteristics, such as those of an inverter or an oscillator. In one example, the connection of the A input terminal to a permanent logic level provides one type of inverter operation. In another example, the interconnection of the A and B input terminals provides another type of inverter operation. The M Circuit can be connected to operate as an oscillator by coupling an output terminal back to the B input terminal and connecting the A input terminal to a constant logic level. Control of the oscillator characteristics is accomplished by the feedback elements used.

Several embodiments of systems formed with a plurality of M Circuits connected in linear and/or planar arrays are disclosed, including gating and resetting arrangements providing advantageous design advantages through the use of such M Circuit arrays. These systems include counters, shift registers, pulse generating and wave shaping devices, Boolean function generators, random function generators, data conversion and data separating systems, electronic lock systems, self-adaptive switcher systems, and learn machines.

BRIEF DESCRIPTION OF THE DRAWINGS

FIG. 3A is a table of the sixteen Boolean functions of a two input gate;

FIG. 5 shows the truth table for the f1 or NOR gate set-reset flip flop shown in FIG. 4A;

FIG. 7A shows the truth table for the M Circuit in NOR gate form, as shown in FIG. 6;

FIGS. 8A and 8B show the waveform diagrams of the A and B input terminals of the M Circuit for the two conditions set forth in rows 7 and 14 of the truth table of FIG. 7A;

FIG. 20A shows a linear array of four M Circuits, and

FIG. 20B shows waveform diagrams which illustrate the operation of the circuit of FIG. 20A;

DETAILED DESCRIPTION OF THE PREFERRED EMBODIMENTS

M Circuits in General

Figure 1:
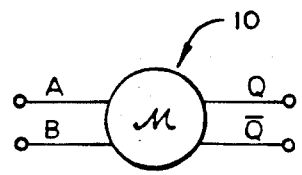
FIG. 1 is a symbolic representation of the M Circuit in the form which will be used in all the figures.

The M Circuit is a circuit from which systems may be constructed. The M Circuit is shown in symbolic form and indicated by the numeral 10 in FIG. 1. Throughout this description of the M Circuit, the two left terminals of the M Circuit will be referred to as inputs, and the two right terminals as outputs. The upper input will be referred to as input A, the lower input as input B, the upper output as output Q, and the lower output as output $\overline{Q}$ (pronounced as "Q not").

The M Circuit operates on a two level binary input at its input terminals A and B, and provides a two level binary output at its output terminals Q and $\overline{Q}$. These two binary levels are referred to as a "1" and a "0" in the literature of Boolean algebra, and this same practice will be followed herein. In Boolean algebra, the "0" binary level is defined as the complement of the "1" binary level, and the "1" binary level is defined as the complement of the "0" binary level. As will be shown below, except during transition times, the Q output of an M Circuit will always be the complement of the $\overline{Q}$ output of an M Circuit, and the $\overline{Q}$ output will always be the complement of the Q output.

Figure 2:
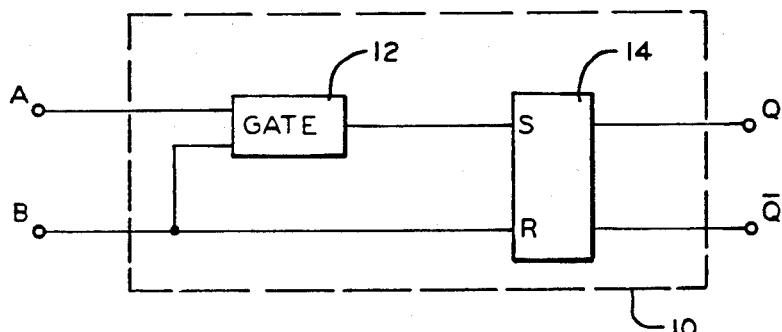
FIG. 2 illustrates one form of representation of the basic elements constituting the M Circuit.

In one sense, an M Circuit may be thought of as the combination of a set-reset flip flop and a gate, or a combination of gates, which provide a Boolean function. This is illustrated in FIG. 2 by a gate 12 connected as shown to a set-reset flip flop 14. The characteristics of the M Circuit 10 are shown and described with reference to the Figures below.

Figure 3B:
FIG. 3B shows a logic representation used for a gate which provides a designated Boolean function.

It is noted that a gate, or a combination of gates, which provide a Boolean function will be referred to herein as a "gate". As is known, a gate is an n input, one output device which will provide one of the $(2)^{2^n}$ functions of n Boolean variables. A table of the 16 possible functions f0 through f15 of a two input gate is shown in FIG. 3A. These 16 functions f0 through f15 of the two Boolean variables X and Y will be referred to in the description below. FIG. 3B is a logic representation used herein for a gate, or a combination of gates, which provide a designated Boolean function.

Referring again to FIG. 3A, one may note that a two input f1 gate will output a "1" for the first input condition, X equals "0", Y equals "0"; and a "0" for each of the other possible input conditions. This may be recognized as the Pierce or NOR function. This function will generate the Boolean algebra. As shown in FIG. 3A, an F2 gate will output a "1" only in the $2^1$ position. An f4 gate will output a "1" in the $2^2$ position. An f7 gate will have outputs which in the binary number system add to decimal 7. This f7 gate may be recognized as the Sheffer or NAND function. This function will generate the algebra. An f11 gate will provide binary outputs which add to decimal 11; and f13 gate will provide binary outputs which add to decimal 13; and an f14 gate will provide binary outputs which add to decimal 14. An f14 gate will be recognized as an OR gate.

Figure 4A:
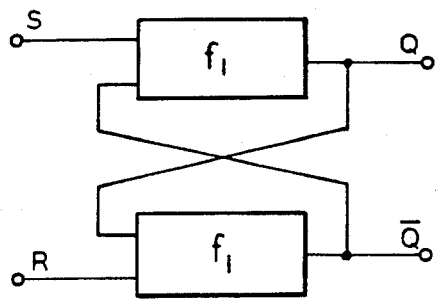
FIGS. 4A through 4E of various gate or gate combinations which constitute the set-reset shown in FIG. 2 for constructing an M Circuit.
Figure 4C:
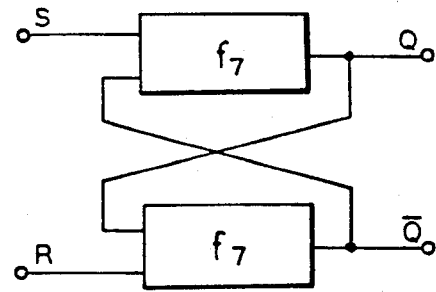
Figure 4B:
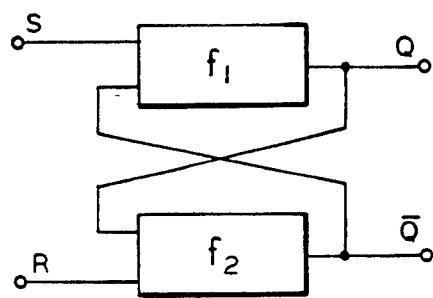
Figure 4D:
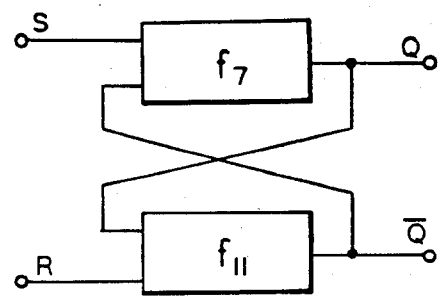
Figure 4E:
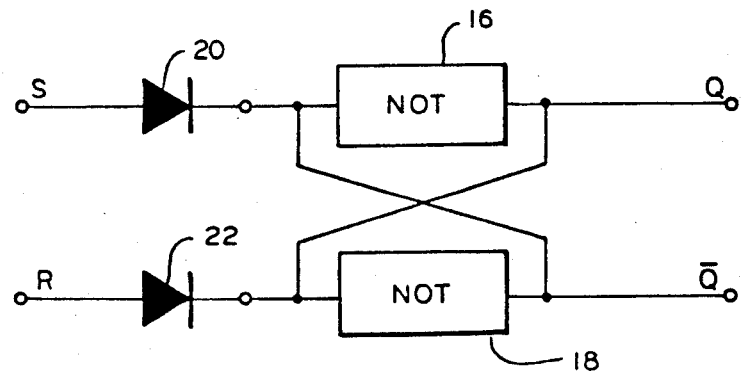

FIGS. 4A–4E show various gate or gate combinations which constitute the set-reset flip flops shown in FIG. 2 for constructing an M Circuit. In FIGS. 4A–4E, the two left terminals are referred to as inputs S and R and the two right terminals as outputs Q and $\overline{Q}$. FIG. 4A shows the combination of a pair of two input f1 gates or NOR gates, FIG. 4B shows the combination of an f1 gate and an f2 gate, FIG. 4C shows the combination of two f7 or NAND gates, and FIG. 4D shows the combination of an f7 gate and an f11 gate. A further possibility is shown in FIG. 4E in which the set-reset flip flop is made of two cross coupled NOT gate circuits 16 and 18 with steering diode inputs 20 and 22, respectively. This is known as the NOT set-reset flip flop. From the standpoint of the truth table or a logic circuit viewpoint, this circuit of FIG. 4E is equivalent to the f1 gate flip flop shown in FIG. 4A, to be described in detail hereinbelow.

FIG. 5 shows the truth table for the f1 or NOR gate set-reset flip flop shown in FIG. 4A. The first column lists $S_o$, the initial S input the second column lists $R_o$, the initial R input; the third column $Q_o$, the initial Q output; and the fourth column lists $\overline{Q}_o$, the initial $\overline{Q}$ output. The next four columns list the A and B inputs and the Q and $\overline{Q}$ outputs for a data change. The rows include those cases where data does not change and therefore shows 20 possibilities. The rows to make particular note of are rows 4, 8, 12, 16, 20 and 17. In rows 4, 8, 12, 16 and 20, the f1 gate set-reset flip flop loses complementation and provides the logic fallacy Q equals $\overline{Q}$. In the data transition of row 17, the final Q and $\overline{Q}$ situation is unpredictable, being dependent upon incremental gain and temperature. This transition is known in the literature as the indeterminate state of the set-reset flip flop.

Figure 6:
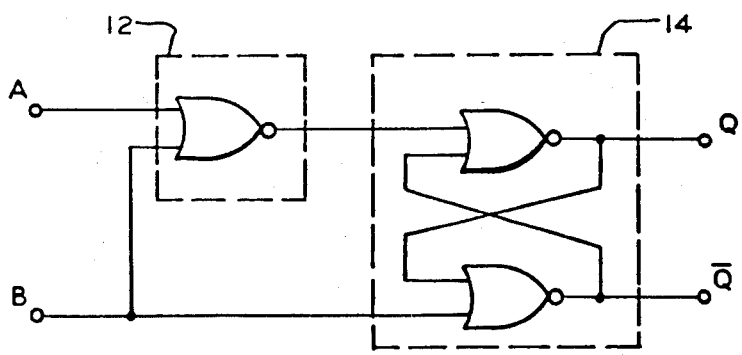
FIG. 6 shows an M Circuit in f1 or NOR gate form.

In FIG. 6, there is shown an M Circuit in f1 or NOR gate form. This will be recognized as a structure of the type shown in FIG. 2 wherein the set-reset flip flop 14 is of the type shown in FIG. 4A and the gate 12 of FIG. 2 is an f1 gate or NOR gate described above. It is to be noted that the M Circuit of the f1 or NOR gate form will be used throughout the remainder of the specification for purposes of conforming the description to a common form of M Circuit.

FIG. 7A shows the truth table for the M Circuit in NOR gate form, shown in FIG. 6. As shown therein, the first four columns list the initial $A_o$ and $B_o$ inputs and the initial $Q_o$ and $\overline{Q}_o$ outputs. The next four columns list the final A and B inputs and the final Q and $\overline{Q}$ outputs. One may note that the M Circuit in NOR gate form will never output the logic fallacy Q equals $\overline{Q}$ as is the case for the NOR gate set-reset flip flop described above in reference to FIG. 5.

Figure 7B:
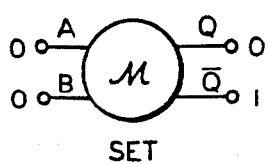
FIGS. 7B, 7C and 7D, respectively, illustrate the logic levels defined for the input and output terminals of the M Circuit in NOR gate form when such M Circuit is in the set condition, the reset condition and the memory condition, respectively.
Figure 7C:
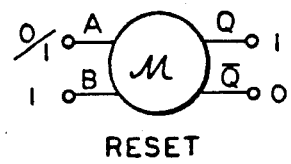

In discussing the M Circuit and M Circuit systems below, the set condition of the NOR M Circuit will be defined as Q equals "0", $\overline{Q}$ equals "1", and the reset condition will be defined as Q equals "1", and $\overline{Q}$ equals "0". The set and reset conditions are illustrated in FIGS. 7B and 7C, respectively. In this connection, it is noted that the M Circuit is in the reset condition when a "1" is on the B input and either a "0" or a "1" is on the A input.

Figure 7D:
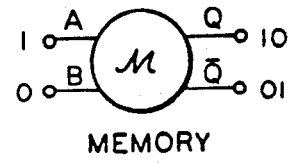

In FIG. 7A, on rows 2, 4, 6, 8, 10, 12, 16, 18 and 20, the M Circuit is in the reset condition after data change. On rows 1, 5, 9, 13, and 17, the M Circuit is in the set condition after data change. On rows 3, 11, 15 and 19, the M Circuit exhibits memory; that is, Q final equals $Q_o$ initial, and $\overline{Q}$ final equals $\overline{Q}_o$ initial. The memory condition is further illustrated in FIG. 7D wherein a "1" is on the A input and a "0" is on the B input. In general, referring to a NOR M Circuit, it is true that when A equals "0", the M Circuit is set; when B equals "1", the M Circuit is reset; and when A equals "1" and B equals "0", the M Circuit is in memory.

It may now be noted that the B input of the M Circuit provides the dual capability of resetting the M Circuit when the B input is a "1", and of enabling the M Circuit to be set by a "0" on the A input when the B input is "0". That is, in every case when the B input is a "1", the M Circuit is in the reset condition wherein Q equals "1" and $\overline{Q}$ equals "0". Also, in every case when the B input is "0", the M Circuit will be set by a "0" on the A input. The significance of these characteristics will be described in detail below. As will be seen more clearly below, this is one of the features of the M Circuit which permits it to be connected in one, two and three dimensional arrays of data separators and processors.

FIGS. 8A and 8B show the A and B inputs for the two conditions set forth in row 7 and row 14 of FIG. 7A. Specifically, FIG. 8A shows a situation at the input of an M Circuit where the A input goes from a "1" to a "0", and B goes from a "0" to a "1" on the data transition at time $t_1$. Transition time $t_1$ represents the condition shown in row 14 of FIG. 7A. If B arrives late, the M Circuit will output an unwanted pulse for the time duration until the B input goes to "1", at which time the M Circuit will reset. This is a row 14 situation at the leading edge. At $t_2$ there is shown the row 7 condition of FIG. 7A where A goes from a "0" to a "1" and B goes from a "1" to a "0". If A arrives late, the M Circuit will set. This is a row 7 situation at the trailing edge. In FIG. 8B, at $t_1$, A goes from a "0" to a "1" and B goes from a "1" to a "0". If A arrives late, the M Circuit will set at $t_1$. This is a row 7 situation at the leading edge. At $t_2$, A goes from a "1" to a "0" and B goes from a "0" to a "1". If B arrives late, the M Circuit will output an unwanted pulse. This is a row 14 situation at the trailing edge.

These row 7 and row 14 situations rarely arise since data transitions generally arrive at the M Circuit inputs A and B simultaneously with the same rise times. Due to long transmission lines or extra capacity on a line, the above situations may arise. However, to avoid these situations one may place a capacitor or other appropriate delay means at the input which causes trouble.

The operation of the M Circuit in NOR form as a memory device was discussed above. The M Circuit may also act as a gate performing NAND, NOR, AND or OR functions. For an M Circuit to be utilized as a gate device, it must be operated sequentially in a pulsed manner. The f1 or NOR M will provide OR and NOR, as indicated in FIG. 3A by the f14 and f1 functions, respectively. In this mode of operation, the A and the B inputs are normally "1". Assume the data to be input comprises two "0's". The two "0" inputs cause the M Circuit to be set, with Q equals "0", $\overline{Q}$ equals "1". When the inputs return to their normal "1" state, the M Circuit will reset. For each of the remaining possibilities, A equals "0", B equals "1"; A equals "1", B equals "0"; and A equals "1", B equals "1"; the M Circuit will remain reset for each possibility and Q equals "1", $\overline{Q}$ equals "0" when pulsed. The output Q thus presents the OR function and $\overline{Q}$ presents the NOR function.

FIGS. 9A–9H show various gate and set-reset flip flop arrangements which may be used to obtain M Circuits. These are only shown by way of example and other arrangements are possible. Some of these are those configurations obtained when a wired OR gate and a wired AND gate are available. It should also be noted that only a three gate arrangement is shown. However, an infinite number of arrangements are possible if additional gates and inverters are used.

Figure 9A:
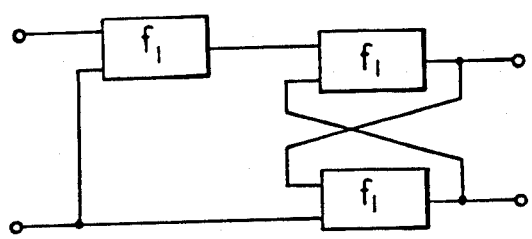
FIGS. 9A through 9H show block diagrams of various gates and set-reset flip flop arrangements which may be used to obtain M Circuits.
Figure 9E:
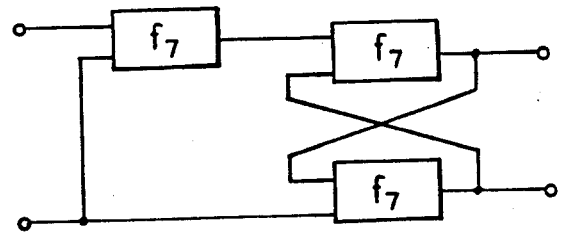
Figure 9B:
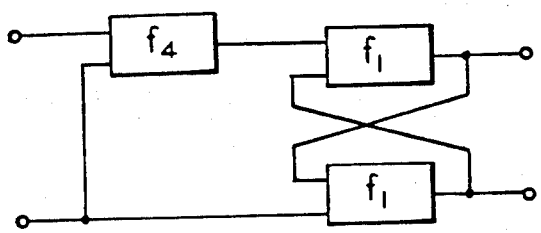
Figure 9F:
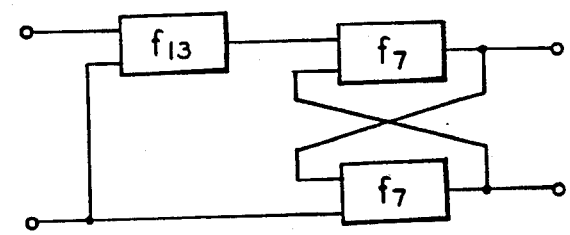
Figure 9C:
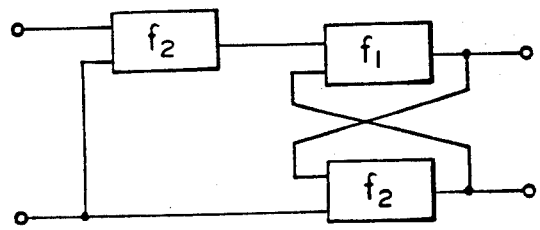
Figure 9G:
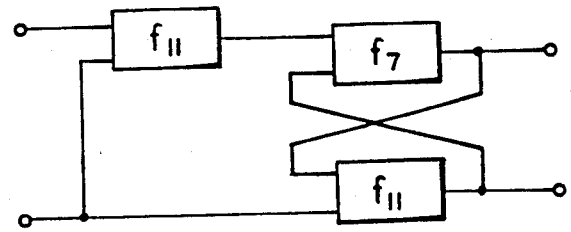
Figure 9D:
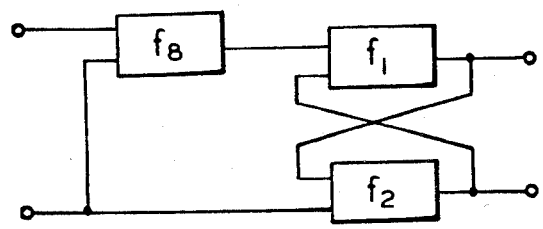
Figure 9H:
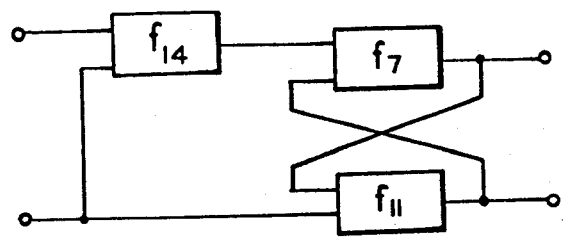

FIG. 9A is the f1 or NOR M Circuit described above. In FIG. 9B, the set-reset flip flop is the same as in FIG. 9A above, but the gate is an f4 gate. FIGS. 9C and 9D show flip flops made up of f1's and f2's with an f2 and an f8 gate, respectively. FIGS. 9E and 9F show M Circuits comprising the f7 or NAND set-reset with an f7 and f13 gate, respectively. FIGS. 9G and 9H use set-reset flip flops made up of an f7 gate and an f11 gate with an f11 gate and an f14 gate, respectively. Another possibility not shown therein is the combination of an f1 gate or an f4 gate with a NOT set-reset flip flop shown above in FIG. 4E. This flip flop is equivalent to the f1 or NOR flip flop of FIG. 4A.

The circuits shown in FIGS. 9A–9H are each M Circuits. The truth tables associated with each may not be exactly the same as that of FIG. 7A. For example, the output "1's" and "0's" may be interchanged, Q may be a "1", and $\overline{Q}$ a "0". However, such M Circuits will perform the operations described herein as long as their truth table differences are noted. That is, each of the M Circuits shown in FIGS. 9B–9H have the common characteristics of the f1 or NOR M Circuit shown in FIG. 6 and FIG. 9A, in that each M Circuit will not produce the logic fallacy (Q equals $\overline{Q}$), it will have a two level binary input and a two level binary output, it will have a set condition, a reset condition and a memory condition, and it will provide the dual capability of resetting the M Circuit and enabling the M Circuit to be set under defined conditions in accordance with the truth table method outlined above.

SINGLE M CIRCUITS

Figure 10A:
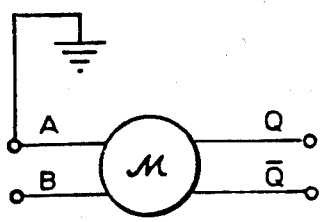
FIGS. 10A through 10E show various M Circuit subsystems.
Figure 10C:
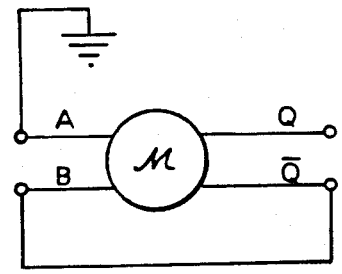
Figure 10D:
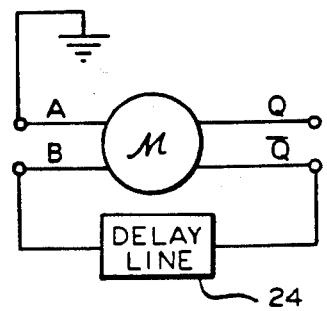
Figure 10E:
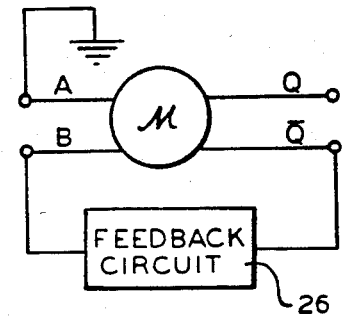
Figure 10B:
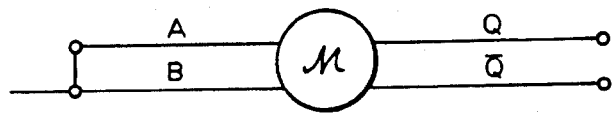

Referring to FIGS. 10A–10E, there are shown various M Circuit subsystems. A single M Circuit may have any of its terminals interconnected to provide various operations. As was stated above, the M Circuit used in the Figures is of the f1 or NOR gate form having the characteristics set forth in the truth table of FIG. 7A. In FIG. 10A the A input is grounded. A "1" at the B input will output Q equals "1", and $\overline{Q}$ equals "0". A "0" at the B input will output Q equals "0", $\overline{Q}$ equals "1". Thus, in this configuration, the M Circuit is an inverter outputting the complement of B at $\overline{Q}$ and the complement of $\overline{Q}$ at Q. In FIG. 10B, the inputs A and B are interconnected so that the inputs are always the same. This is another type of inverter.

FIG. 10C shows another M Circuit wherein the A input is placed at logic "0" and the $\overline{Q}$ output is connected to the B input. If $\overline{Q}$ is a "1", B will be a "1", this "1" at B will cause the M Circuit to reset providing Q equals "1", $\overline{Q}$ equals "0.". This "0" at B will cause the M Circuit to set since the A input is "0". This sequence will continuously repeat itself at the natural frequency of the M Circuit and thus the M Circuit in this configuration is an oscillator. If means are provided at the A input so that A may be changed at will, or on data demand, from a "0" to a "1" and from a "1" to a "0", the oscillations will stop when A is "1" and the oscillations will start when A is a "0".

The frequency of oscillation of the M Circuit of FIG. 10C may be controlled by placing an element in the $\overline{Q}$ output to B input connection. As shown in FIG. 10D, this may comprise a delay line indicated by the numeral 24. Delay lines may be constructed with high accuracies and stability. Accordingly, the M Circuit shown in FIG. 10D may provide an accurate time base oscillator.

In general, the feedback circuit in the $\overline{Q}$ output to the B input may be of any desirable form and is designated in FIG. 10E as numeral 26. This feedback circuit may be a delay line, a crystal, various combinations of capacitors, inductors, resistors, and so on in known configurations. These may be selected using filter and feedback theories to obtain various outputs in conjunction with the enabling and disabling effect of the A input. The feedback elements are not restricted to passive components. Active elements, such as operational amplifiers and their known analog connections, may also be used. The methods by which assemblages of circuits of this type may be provided to obtain oscillating, pulse generating, and wave shaping systems will be described below.

GATES CONNECTED TO M CIRCUITS

The M Circuit described above and arrangements of M Circuits, some of which will be described below, may be connected to gates. Two types of gates will be referred to herein as "class 1" and "class 2" gates. A class 1 type of gate is defined herein as a gate which operates in a mode wherein a data change will occur at the output for any data change, in any possible combination, at the input where all of the inputs were initially at the same level. A class 2 type of gate is defined as a gate which operates in a mode wherein a data change at the input will not provide a data change at the output unless the gate is enabled.

Figure 11A:
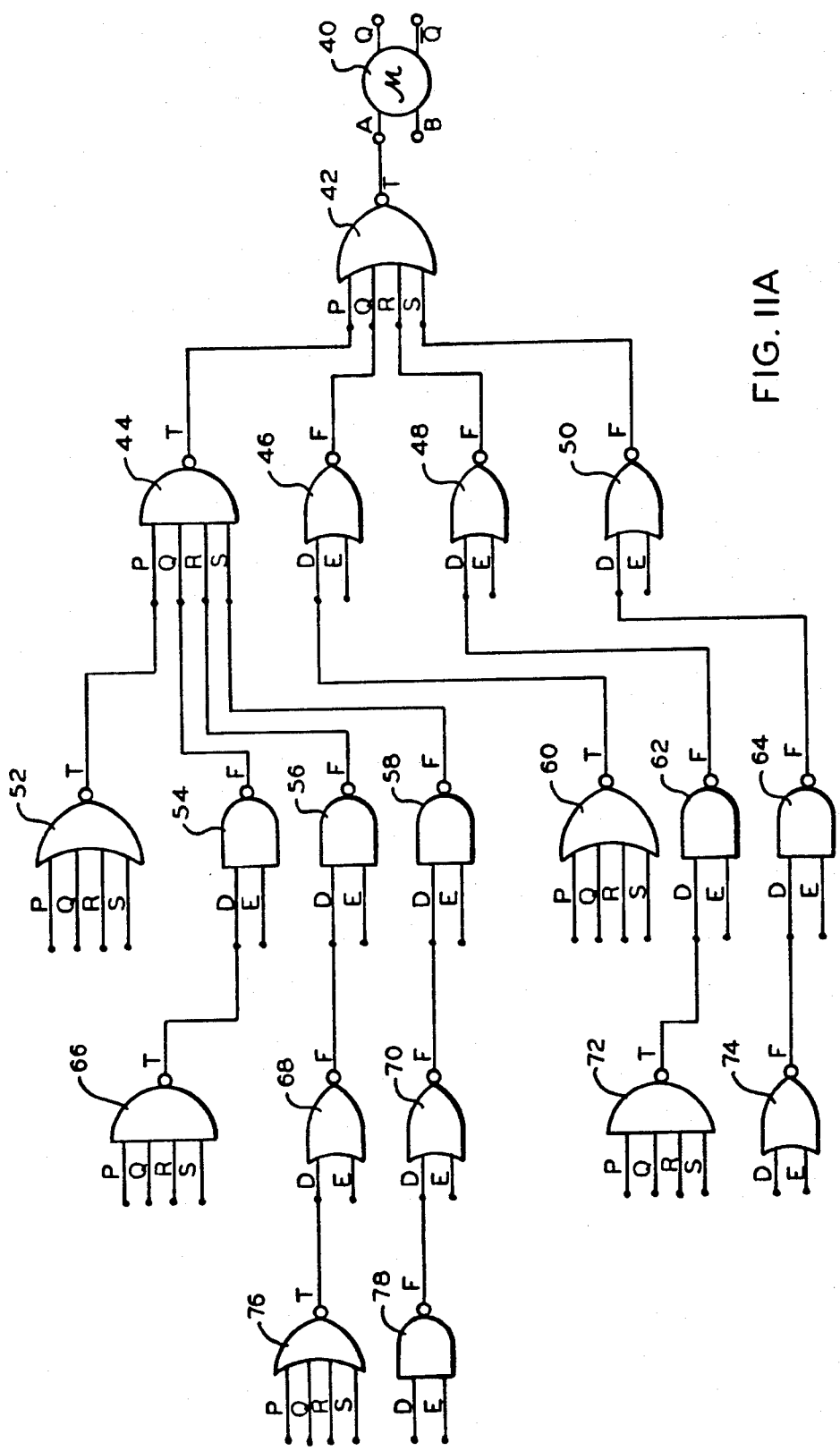
FIGS. 11A through 11F show various types and arrangements of gates connected to M Circuits.

In the FIG. 11A, the gates 42, 44, 52, 60, 66, 72 and 76 are class 1 types of gates in their mode of operation. The input lines of each class 1 type of gate is indicated by the letters P, Q, R and S, and the output line is indicated by the letter T. On the other hand, gates 46, 48, 50, 54, 56, 58, 62, 64, 68, 70, 74 and 78 are class 2 types of gates in their mode of operation. The input lines of each class 2 type of gate is indicated by the letters D and E, and the output line is indicated by the letter F. In terms of the actual hardware which forms the class 1 and class 2 types of gates, such gates are NAND and NOR gates as shown in FIGS. 11A–F.

In FIG. 11A the A input of M Circuit 40, referred to as M40, is connected to the T output of class 1 gate 42. The inputs P, Q, R and S of gate 42 are normally "0" and the output T is normally "1". Any data change or combination of data changes to gate 42 at the inputs will provide a "0" at the output T. This "0" at the A input of M40 will set M40 if the B input is "0".

The P input of class 1 gate 42 is connected to the output of class 1 gate 44. The P, Q, R and S inputs of gate 44 are normally "1" and the output is normally "0". Any data change or combination of data changes to a "0" at the input of gate 44 will appear at the T output as a "1" and M40 will set as described above.

The P input of class 1 gate 44 is connected to the T output of class 1 gate 52. The gate chains which can be connected to the input to gate 52 are of the same type as the gate chains associated with gate 42 and, therefore, a further gate chain for the gate 52 will not be shown or described.

The Q input of gate 44 is shown connected to the F output of class 2 gate 54. The input D of gate 54 refers to data, while the input E refers to an enable of gate 54. These inputs D and E are normally "0" and the output of gate 54 is normally "1". A data change from a "0" to a "1" at the D input of gate 54 will not appear as a data change at the output F if the E input is "0". If the E input is "1", a data change at the D input from a "0" to a "1" will appear at the F output as a "0". As described above, this "0" at the F output of gate 54 will appear at the Q input to gate 44 causing a "1" at the T output of gate 44 which in turn causes a "0" at the T output of gate 42. In turn, the "0" at the T output of gate 42 appears at the A input of M40, and M40 will set if its B input is "0", as described above.

The D input of gate 54 is connected to the output of class 1 gate 66. The gate chains which can be connected to the input of gate 66 are of the same type as the gate chains associated with gate 44 and, therefore, further gate chains for the gate 66 will not be shown or described.

The R input of gate 44 is connected to the F output of class 2 gate 56. The gate chain operation of gate 56 is essentially the same as the operation for gate 54 described above except that the D input is connected to the F output of class 2 gate 68.

The D and E inputs of class 2 gate 68 are normally "1" and the F output is normally "0". A data change from a "1" to a "0" at the D input will not appear as a data change at the output if the E input is a "1". If the E input is "0", a data change at the D input from a "1" to a "0" will appear at the output as a "1", and M40 will set as described above. The D input of gate 68 is connected to the T output of class 1 gate 76. The gate chain operation of class 1 gate 76 is the same as the operation of class 1 gate 42.

The S input of class 1 gate 44 is connected to class 2 gate 58 which in turn is connected at its input to class 2 gate 70. The gate chain operation of gate 58 and gate 70 is the same as the operation of gate 56 and gate 68 described above, except that the D input of gate 70 is connected to the output of a class 2 gate 78. The operation of gate 78 is the same as the operation of gate 54, gate 56 and 58 described above.

The Q output of gate 42 is connected to the output of class 2 gate 46. The gate chain operation of gate 46 is the same as the operation of class 2 gate 68 described above.

The R input of gate 42 is connected to the output of class 2 gate 48. The D input of gate 48 is connected to the output of class 2 gate 62 which in turn is connected at its D input to class 1 gate 72. The operation of gate 48 is the same as the gate chain operation of class 2 gate 70 described above.

The S input of gate 42 is connected to the output of class 2 gate 50. The D input of gate 50 is connected to the output of class 2 gate 64 which in turn is connected at its D input to class 2 gate 74. The gate chain operation of gate 50 is the same as the operation of class 2 gate 58 described above.

Figure 11B:
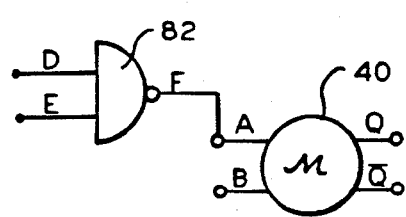

Referring to FIG. 11B, there is shown another method of selectively feeding data to the A input of an M Circuit. FIG. 11B illustrates selective feeding to a class 2 gate 82 as contrasted with the selective feeding of data to the class 1 gate 42 as described above with reference to FIG. 11A. In FIG. 11B, there is shown the F output of class 2 gate 82 connected to the A input of M40. The gate chain operation of gate 82 is the same as the operation of gates 54, 56 and 58 described above except that, here, the change from a "1" to a "0" at the output of gate 82 will set M40.

Figure 11C:
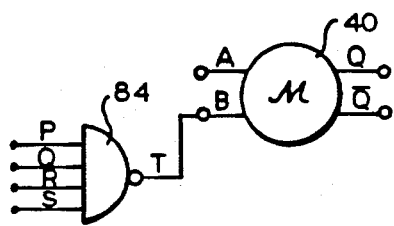

FIG. 11C shows the preferred method of selectively feeding data through a class 1 type of gate 84 to the B input of an M Circuit 40. In FIG. 11C, the T output of class 1 gate 84 is connected to the B input of M40. The gate chain operation of gate 84 is the same as the operation of class 1 gate 44 described above except that, here, the data change at the output of gate 84 will reset M40.

Figure 11D:
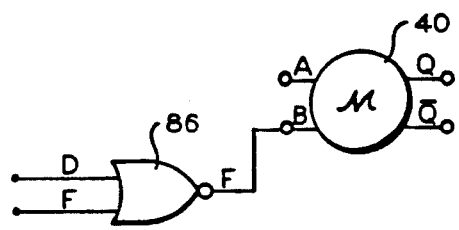

FIG. 11D shows the preferred method of selectively feeding data through a class 2 type of gate 86 to the B input of an M Circuit 40. In FIG. 11D, the input B of M40 is shown connected to the F output of class 2 gate 86. The gate chain operation of gate 86 is the same as the operation of class 2 gates 46, 48 and 50 described above except that, here, a change at the output of gate 86 will reset M40.

Figure 11E:
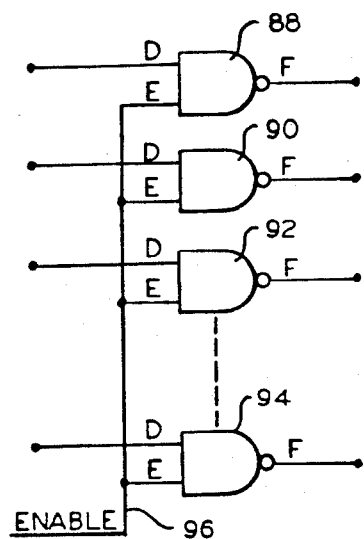

In FIG. 11E, there is shown a gating arrangement wherein a plurality of class 2 type of gates 88, 90, 92 and 94 are combined for parallel operation. The gates shown are NAND gates having their E input lines connected to a common enable line 96. In the arrangement shown, a high or "1" signal on the enable line 96 will allow data to pass through the gates.

Figure 11F:
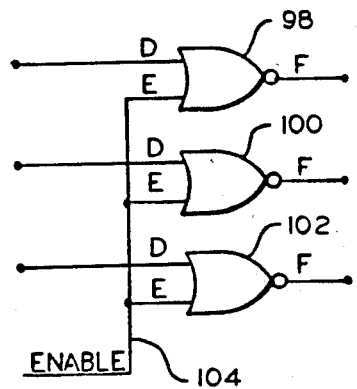

FIG. 11F shows a parallel arrangement of class 2 type of gates similar to the arrangement shown in FIG. 11E wherein a plurality of class 2 gates 98, 100, and 102 have their E inputs connected to a common enable line 104. In this arrangement, the gates 98, 100 and 102 are NOR gates. In the arrangement of FIG. 11F, a low or "0" provided at line 104 to the E input will enable data to pass through the gates.

In any specific application of M Circuits, arrangements of class 1 gates and class 2 gates may or may not be found in any of the infinite number of arrangements which may be provided using the methods described above. The importance of the concept of these two types of gates and their interconnections is that this type of gating concept provides a method of directly translating specifications for data generating, data processing and data separating systems into the M Circuit systems. That is, prior art generating, data processing and data separating systems ordinarily provide specifications which must first be translated into some form of mathematics, such as Boolean algebra in logic systems, before an appropriate circuit can be designed to implement the specifications. However, through the use of the M Circuit systems including the gate arrays described herein, the need for such mathematical translations is eliminated.

Figure 12A:
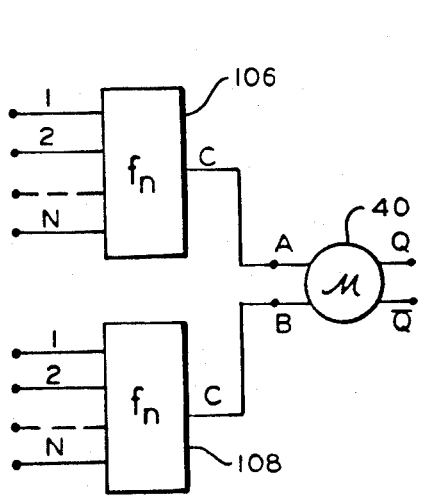
FIGS. 12A, 12B and 12C show general types of gates and gating connections to an M Circuit.
Figure 12B:
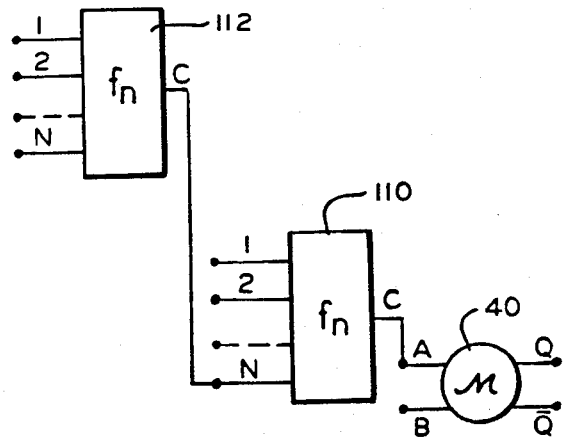

Referring to FIG. 12A, there is illustrated the general method of connecting gates to M Circuits. Here, the C output of a gate 106 providing a Boolean function, indicated as $f_n$, is connected to the A input of M40, and the C output of another $f_n$ function gate 108 is connected to the B input of M40. In FIG. 12B, there is shown an $f_n$ gate 110 connected to M40 as described above. Here, the N input to gate 110 is connected to the C output of a further $f_n$ function gate 112. This process may be extended infinitely.

Figure 12C:
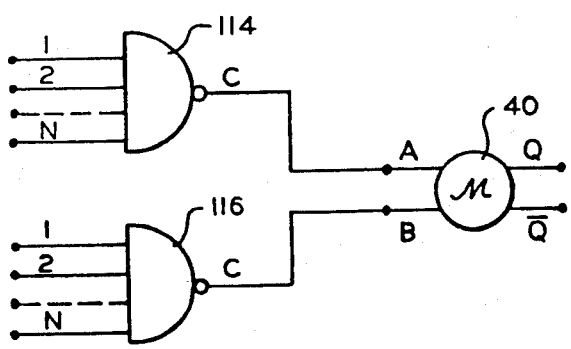

In FIG. 12C, there is shown another useful connection of general types of gates to an M Circuit. Here, the A input of M40 is connected to the C output of NAND gate 114. The inputs 1, 2, ..., N, of NAND gate 114 are normally "0" and the output C of NAND gate 114 is normally "1". Also, a NAND gate 116 operates in a similar manner as the NAND gate 114 except that the C output of NAND gate 116 is connected to the B input of M40. For M40 to set, the 1, 2, ... N inputs of NAND gate 114, and the 1, 2, ... N inputs of NAND gate 116 must all be "1" thereby providing a "0" at both the A and B inputs to M40. This is a coincidence circuit.

LINEAR M CIRCUIT ARRAYS

The M Circuit is useful when used in combination with other M Circuits. In general, all interconnections of inputs and inputs, outputs and inputs, outputs and outputs, and combinations thereof are useful. The only care which must be exercised is to insure that outputs are not interconnected unless the M Circuit design provides for wired AND or wired OR at the outputs.

In FIG. 13, there is shown a number of possible two M Circuit interconnections. In the arrangement of FIG. 13A, two M Circuits M120 and M122 have their A inputs connected together by line 124. In this case a "0" on the A line will set M120 or M102 or both, if the respective B inputs are "0". This connection is useful in the selective transfer of data from an M system to M120 and/or M122 which may be of a type of memory bank. In FIG. 13B, the A input of M126 is connected by a line 130 to the B input of M128. In this arrangement, a "0" at the A input of M126 will prevent M128 from being reset if M128 is set during the "0" at the A input. When the A input of M126 is "1", M128 will always be reset. In FIG. 13C, the B input of M132 is connected via line 136 to the A input of M134. Here, a "0" at the B input of M132 will enable M134 to set if the B input of M134 is "0" or goes to "0" while the B input of M132 is "0". When the B input of M132 is "1", M134 is set or reset depending upon the input history at the B input of M134. That is, the M134 is placed in memory, set or reset, when its B input is at "0" and its A input is at "1". The Q and $\overline{Q}$ outputs of M134 are determined by whether M134 was in the set or reset condition prior to being placed in memory. In FIG. 13D, the B input of M138 is connected via line 142 to the B input of M140. Here, a "1" on the B line resets both M138 and M140, and a "0" on the B line enables M138 and M140 to be set. In FIG. 13E, the Q output of M144 is connected via line 148 to the A input of M146. Here a "0" at the Q output of M144 will be applied on line 148 to set M146 if the B input of M146 is "0". This interconnection is also used to transfer data from an M Circuit or M Circuit system to a memory bank. In FIG. 13F, the $\overline{Q}$ output of M150 is connected via line 154 to the B input of M152. In this interconnection, when M150 is reset, M152 is enabled to be set at the B input, and when M150 is set, M152 is reset.

Figure 13A:
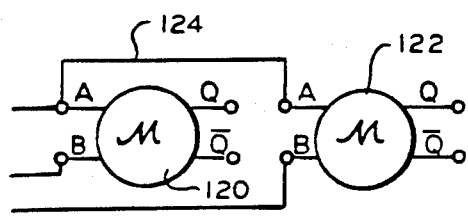
FIGS. 13A through 13I show various arrangements of two M Circuits interconnected at their input and output terminals.
Figure 13B:
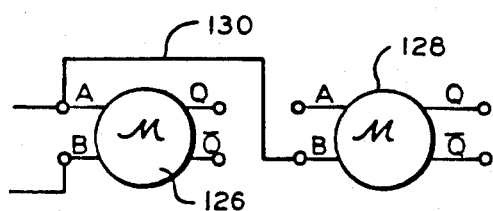
Figure 13C:
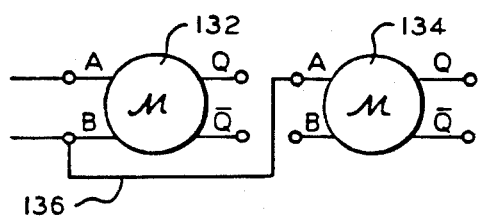
Figure 13D:
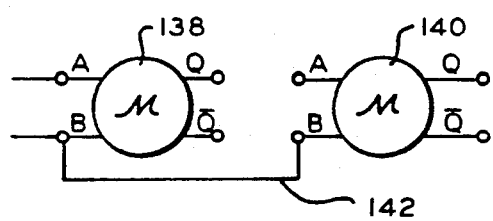
Figure 13E:
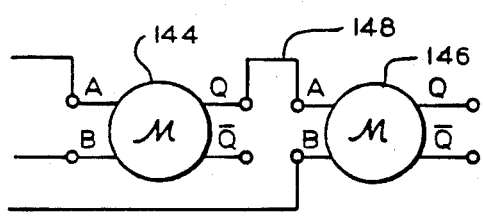
Figure 13F:
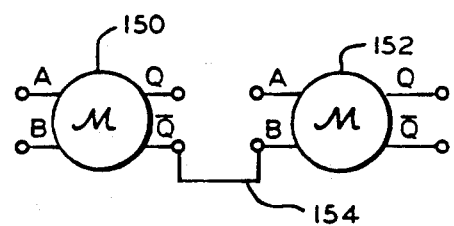
Figure 13G:
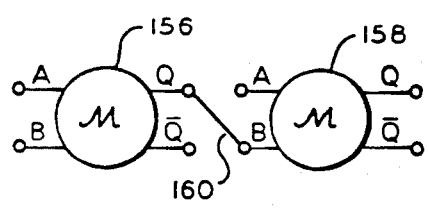
Figure 13H:
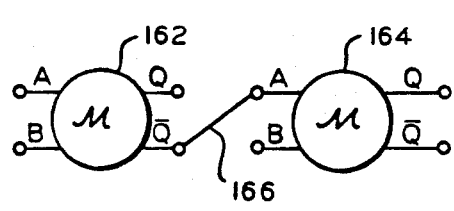
Figure 13I:
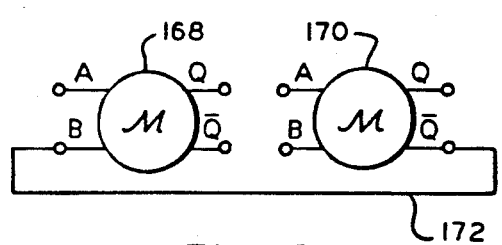

Another very useful M Circuit interconnection is shown in FIG. 13G. In this arrangement, the Q output of M156 is connected via line 160 to B input of M158. When M156 is reset M158 is also reset. When M156 is set, M158 is enabled by a "0" at its B input and a "0" at its A input will set M158. If both M156 and M158 are set, a "1" at the B input of M156 will reset both M156 and M158. It may be noted that, in this interconnection, the ability of the B input of M156 to both enable M156 and M158 to set, and to reset both M156 and M158 is an operation previously performed in known systems by separate inputs. In FIG. 13H, the $\overline{Q}$ output M162 is connected via line 166 to the A input of M164. In this interconnection, when M162 is reset, M164 is enabled at the A input to set if the B input of M164 is or goes to "0". Now, if M162 is set, the A input of M165 is "1" and M164 is set or reset depending upon the input history at the B input of M164. In FIG. 13I, the $\overline{Q}$ output of M170 is connected via line 172 to the B input of M168. In this interconnection, if M170 is reset, M168 is enabled at the B input to be set, and if M170 is set, M168 is reset. Interconnections using more than two M Circuits are described below.

Figure 14A:
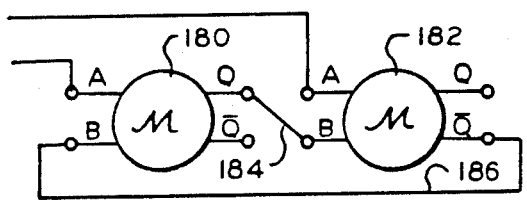
FIGS. 14A through 14F show various combinations of interconnections of two M Circuits.

Referring to FIGS. 14A–14F, there are shown, by way of example, combinations of interconnections. It is obvious that the number of possible interconnections is infinite when the gates and gate chains described above are placed at the input and output terminals of M Circuits. In FIG. 14A, the combination of the interconnections of FIG. 13G and FIG. 13I is shown, wherein the Q output of M180 is connected via line 184 to the B input of M182, and the B input of M180 is connected via line 186 to the $\overline{Q}$ output of M182. In this combination of interconnections, if M180 and M182 are set, M180 and M182 are immediately reset by the "1" at $\overline{Q}$ of M182 applied via line 186 to the B input of M182. To illustrate the operation, assume as a first input condition, that a "1" is applied to the A input of M180 and a "0" is applied to the A input of M182. Here, M180 is in memory in reset, and M182 is reset. M180 is in memory in reset because any B input to M180 could not possibly be a "1". This can be shown by assuming that the B input of M180 is a "1" thereby causing M180 to be reset with its Q output providing a "1" which in turn resets via line 184 the M182 resulting in a "0" at the $\overline{Q}$ output of M182. This "0" at the $\overline{Q}$ of M182 is fed back on line 186 to the B input of M180. Thus, M180 cannot be in reset since its B input is a "0". Also, since, according to the assumption, the A input of M180 is a "1", then M180 cannot be set. Now, let us assume as a second input condition that a "0" is applied to the A input of M180 and a "1" is applied to the A input of M182. This "0" at the A input of M180 will set M180 and thereby provide a "0" on line 184 to the B input of M182. The "0" at the B input of M182 enables M182 to be set. With a "1" at the A input and a "0" at the B input of M182, M182 will be in memory in reset, since its last condition was reset. It is noted at this point that the set, reset and memory logic associated with the M Circuits is described above in reference to FIGS. 7B, 7C and 7D. Assume that as a third condition a "1" is placed on the A input of M180 and a "0" is placed at the A input of M182. The "1" at the A input of M180 places M180 in memory in set while the "0" at the A input of M182 sets M182. With M182 set, a "1" at the $\overline{Q}$ output of M182 will reset M180, and the resulting "1" at the Q output of M180 will be applied via line 184 to the B input of M182 to reset M182. With M182 reset, the "0" at the $\overline{Q}$ output will place M180 in memory in reset. It is noted that M180 is in memory in reset because its last condition was the reset condition prior to being placed in memory according to the circuit analysis described above. Thus, M180 is in memory in reset and M182 is reset for the third input condition described above.

Figure 14B:
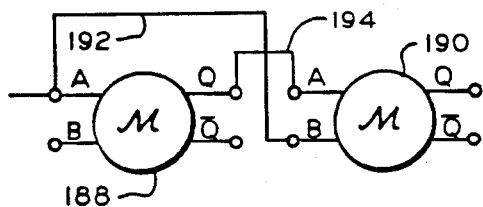

FIG. 14B shows the combination of the interconnections of FIGS. 13B and 13E above, wherein the A input of M188 is connected via line 192 to the B input to M190, and the Q output of M188 is connected via line 194 to the A input of M190. In this arrangement, a "0" at the A input of M188 will set M188 and will set M190 since the Q output of M188 will be "0". The A input of M190 will be "0" and the B input of M190 will be "0" since the A input of M188 is "0". Thus, M190 will be set as long as the A input of M188 is "0". Of course, a "1" at the B input of M188 will reset M188 and place a "1" at the A input of M190.

Figure 14C:
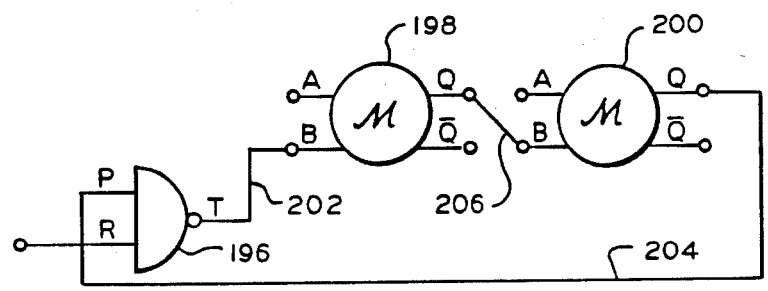

In FIG. 14C, the use of class 1 gates described with reference to FIGS. 11A–11E is shown in an M Circuit interconnection. Gate 196 is a class 1 type of gate having its T output connected via line 202 to the B input of M198, and the P input of such gate 196 is connected via line 204 to the Q output of M200. Also, the Q output of M198 is connected via line 206 to the B input of M200. M198 and M200 initially will be reset. This may be accomplished, for example by placing a momentary "0" on input line R to class 1 gate 196, which produces a "1" at the T output of gate 196 to reset M198 and in turn reset M200. By removing the "0" at the R input to gate 196, its T output will return to "0" and thereby enable M198 to be set. If M198 and M200 are then set, the "0" at the Q output of M200 will provide a "0" at the P input of gate 196 thereby resetting M198 and M200.

Figure 14D:
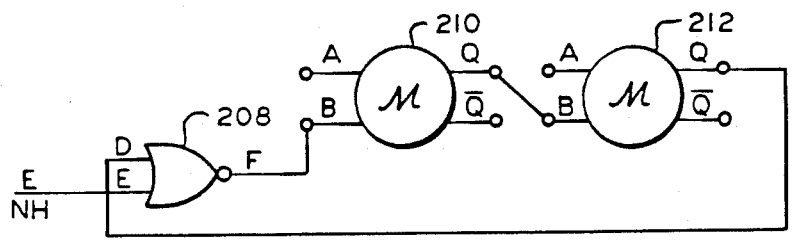
Figure 14E:
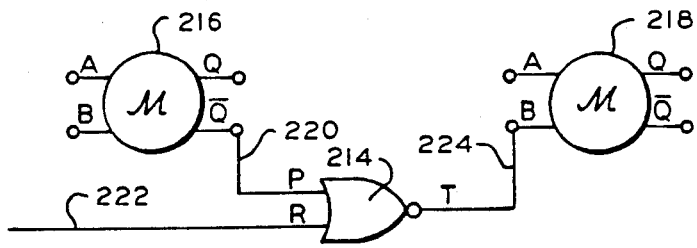

A similar circuit is shown in FIG. 14D except that, here, a class 2 type of gate 208 is used in place of the class 1 gate 196. Gate 208 will not permit M210 and M212 to be reset by the setting of M212 unless the enable input E of gate 208 is "0". In FIG. 14E, there is shown a class 1 gate 214 connected between M216 and M218. In this arrangement M218 will be enabled at its B input if M216 is set or if the R line of class 1 gate 214 is "1". This is because the gate 214 normally receives a "0" or low at its P and R input lines 220 and 222 and provides a "1" or high at its T output line to the B input of M218, thereby holding M218 reset. A change at either of the input lines 220 and 222 to the gate 214 will produce a low or "0" at its output, thereby enabling M218. If, however, the R input line 222 of gate 214 is normally "0", a "1" on line 222 will reset M218. In this form, this connection may be used to provide high speed resetting at any or all stages of an M Circuit system.

Figure 14F:
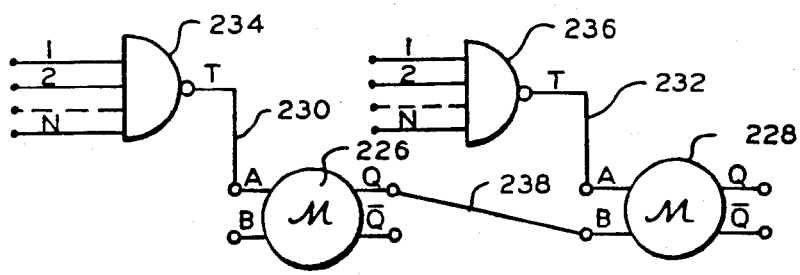

In FIG. 14F, two M Circuits are interconnected as shown in FIG. 13G above. The A inputs of M226 and M228 are connected, respectively, via lines 230 and 232 to the T outputs of gates 234 and 236. The inputs 1, 2, . . . , N of gates 234 and 236 are normally "0". When all the inputs of gate 234 and gate 236 go to "1" the T outputs will go to "0" and M226 and M228 will set if the B input of M226 is "0". This is another example of a coincidence circuit.

It is to be noted that it is possible to connect the outputs of two or more M Circuits to an OR and an AND gate, particularly a wired OR or a wired AND gate if the M Circuits are designed to allow the wired OR or the wired AND interconnection. This is illustrated by the circuits of FIGS. 15A–I, of which FIGS. 15A through 15D illustrate the various interconnections of wired AND gates, and FIGS. 15E through 15I illustrate the various wired OR interconnections. Although shown on these Figures as wired AND and OR circuits, the outputs may also be combined with logic AND and OR gates, or in general with any $f_n$ gates. The specific discussion of the operation of the AND gates, indicated by numeral 240, and the OR gates, indicated by numeral 242, will not be given since these gates are well known devices, and the description of the M Circuit and many of its basic interconnections is already provided above.

Figure 15A:
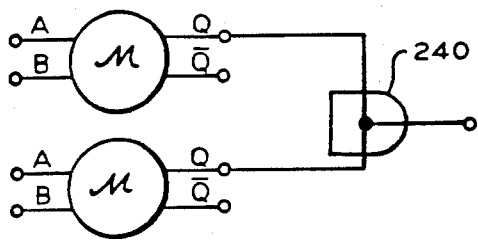
FIGS. 15A through 15I show various wired AND gate and wired OR gate interconnections of the output terminals of two M Circuits.
Figure 15E:
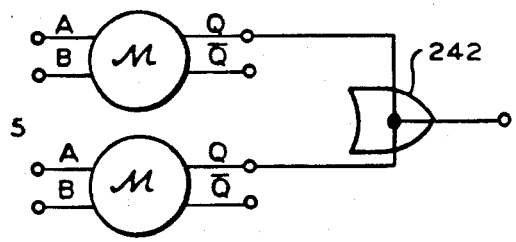
Figure 15B:
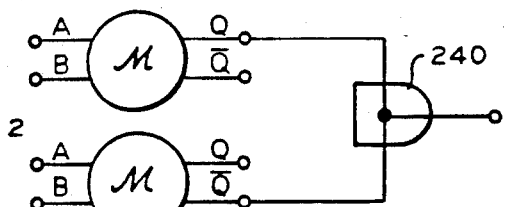
Figure 15F:
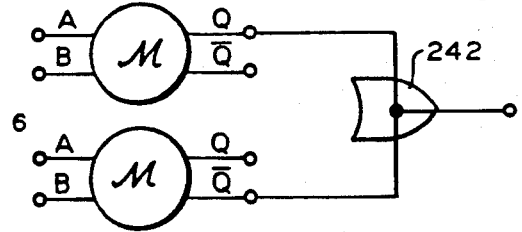
Figure 15C:
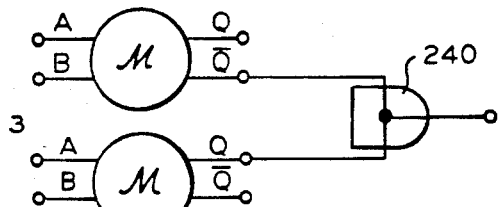
Figure 15G:
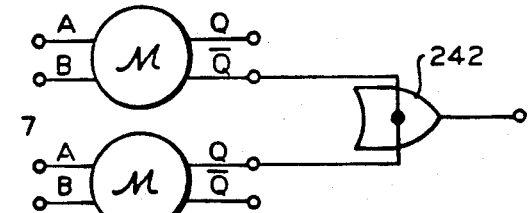
Figure 15D:
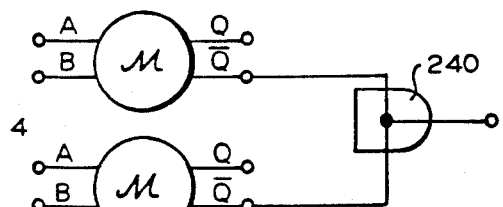
Figure 15H:
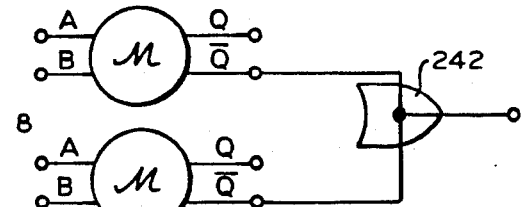
Figure 15I:
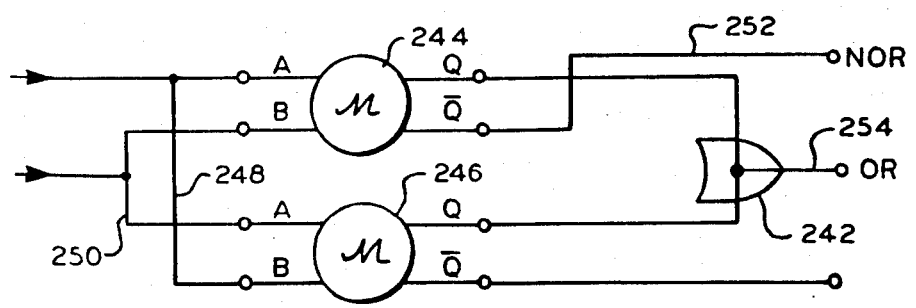

However, a particularly useful wired OR interconnection is shown in FIG. 15I. Here, the A input terminal of M244 is connected via line 248 to the B input of M246 and the B input of M244 is connected via line 250 to the A input of M246. Also, the Q outputs of M244 and M246 are connected to the wired OR 242. This circuit arrangement will provide a NOR function from the $\overline{Q}$ output of M101 on line 252 and an OR function from the wired OR gate 242 in response to inputs on the lines 248 and 250. By using the two M Circuits as shown, it is no longer necessary to have pulsed operation to generate the NOR function or the algebra. Specifically, a "1" on either input line 248 or 250 will reset one of the M Circuits, causing it to provide a Q output which is a "1" which when ORed in OR gate 242 will provide a "1" output on line 254. When both input lines 248 and 250 go to "0", however, both M Circuits will be set and both output lines to OR gate 242 will be "0", providing a "0" output on line 254. This is the OR function. The NOR output is taken from the $\overline{Q}$ output of M244 on line 252. Only when both M Circuits are set will the $\overline{Q}$ output of M244 be "1". If M244 tries to set when M246 is reset, the "1" from the Q output of M246 will prevent it from doing so. Similarly, if NAND M Circuits are used instead of the NOR type M Circuits described herein, an arrangement may be constructed to give NAND and AND outputs.

LINEAR ARRANGEMENTS OF M CIRCUITS

Figure 16:
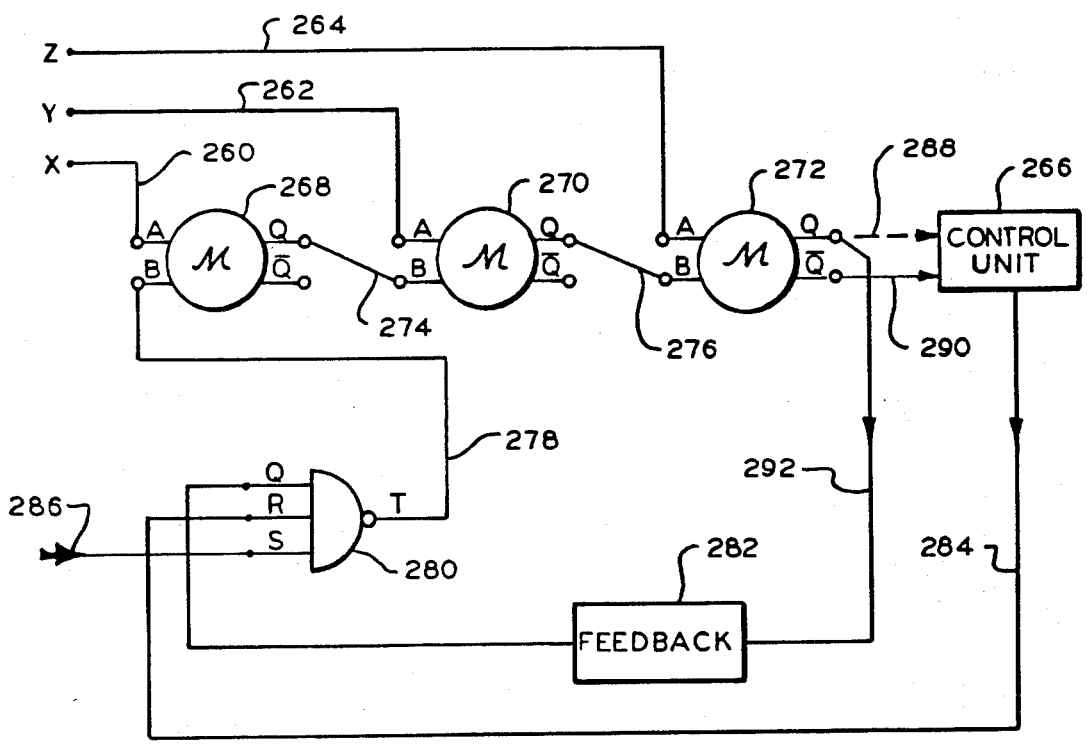
FIG. 16 shows one manner of connecting three M Circuits in a linear array.

One example of an arrangement of M Circuits in a linear array is shown in FIG. 16. In this arrangement, when three input conditions, represented by the letters X, Y and Z on lines 260, 262 and 264, have occurred in the manner to be described below, it is desired to activate a control unit indicated by control block 266. To implement this control function, three M Circuits 268, 270 and 272 are employed. Each of these M Circuits has its A input terminal connected to one of the input condition lines 260, 262 and 264. The Q output of M268 is connected via line 274 to the B input of M270 and the Q output of M270 is connected via line 276 to the B input of M272. The B input of M268 is connected via line 278 to the T output of class 1 gate 280.

The Q input of gate 280 is shown connected to the Q output of M272 through a feedback means 282, such as a delay line, or a feedback circuit of the type 26 of FIG. 10E above. The R input of gate 280 is connected to data line 284 from the control unit 266. The S input to gate 280 is shown connected to an external reset line 286. The feedback means 282 may or may not be present in any of the reset loops, depending on circuit design considerations. The Q or the $\overline{Q}$ output of M272, or both, may be connected to the control unit 266, as indicated by dotted line 288 and line 290, respectively.

Initially, assume that a reset pulse at the B input of M268 will have reset the linear M array comprising M268, M270 and M272 as described above. The Q, R and S inputs of gate 280 will each be a "1" to provide a "0" on the output of line 278 leading into the B input of M268.

The operation of this circuit as a processor of serial data will be now described. If condition X occurs, represented by a "0" at the A input of M268, M268 will set, and thereby enable M270 to be set by a "0" at its A input. If condition Y occurs, a "0" will be present at the A input of M270, and M270 will set and thereby enable M272 to be set by a "0" at its A input. If condition Z occurs, M272 will set, due to the presence of a "0" at both its A and B inputs, thereby activating control unit 266 via one or both lines 288 and 290. When M272 is set, a "0" is provided at its Q output which is applied on a feedback line 292 through the feedback means 282, if provided, to the Q input of gate 280. Receipt of the gate 280 of the "0" at its input will produce a "1" at its output, which in turn is applied to M278, resetting the linear M system.

If feedback line 292 is not present, the control unit 266 may be in a position to reset the M system by providing a "0" line 284 upon activation of control unit 266. Often, in systems of this type, it will be found that when Z is "0", X is "0". But, when Z goes to "1", X goes to "1". To provide reset in this case wherein reset is provided by reset line 292, the circuit of FIG. 14B replaces M272 of FIG. 16. In this latter interconnection employing the M188 and M190 of FIG. 14B, the "0" at Z will prevent the last M Circuit 190 from being reset so that the "0" provided on line 292 will hold M268 in reset until Z goes to "1", at which time the Q output on line 292 goes to "1", keeping M268 in the reset condition as described above.

This same M system will process parallel data. For example, if X, Y and Z occur simultaneously as "0's" at the A inputs of M268, M270 and M272, M268 will set, then M270 will set, then M272 will set and the activation of control unit 266 and the reset process will occur as described above. Other modes of operation may also be employed. For example, X may occur first and then Y and Z occur in parallel; or X and Y may first occur in parallel, and then Z, and the circuit will also set. It is to be pointed out that it is impossible for M272 to set unless the two previous M Circuits M268 and M270 have set. Thus, if Z occurs first, M272 will not set since it will be held off by a "1" at the output from M270 at its input B. However, as soon as M268 and M270 have set, and as long as the "0" is present on its A input, M272 will be set. When M272 sets, its Q output will be provided on line 288 to control unit 266 to cause the required event to occur.

Generally, the circuit of FIG. 16 will work either in serial, parallel or a mixed serial and parallel mode. In addition, six circuits of this type could be employed to separate the serial presentation of XYZ, XZY, YXZ, YZX, ZXY and ZYX. Also, serial and parallel mixed events may be separated by circuits of this type. In the example of FIG. 16, only three M Circuits have been used. It should be apparent, however, that the number of M Circuits and inputs may be two, or may be extended indefinitely.

Figure 17:
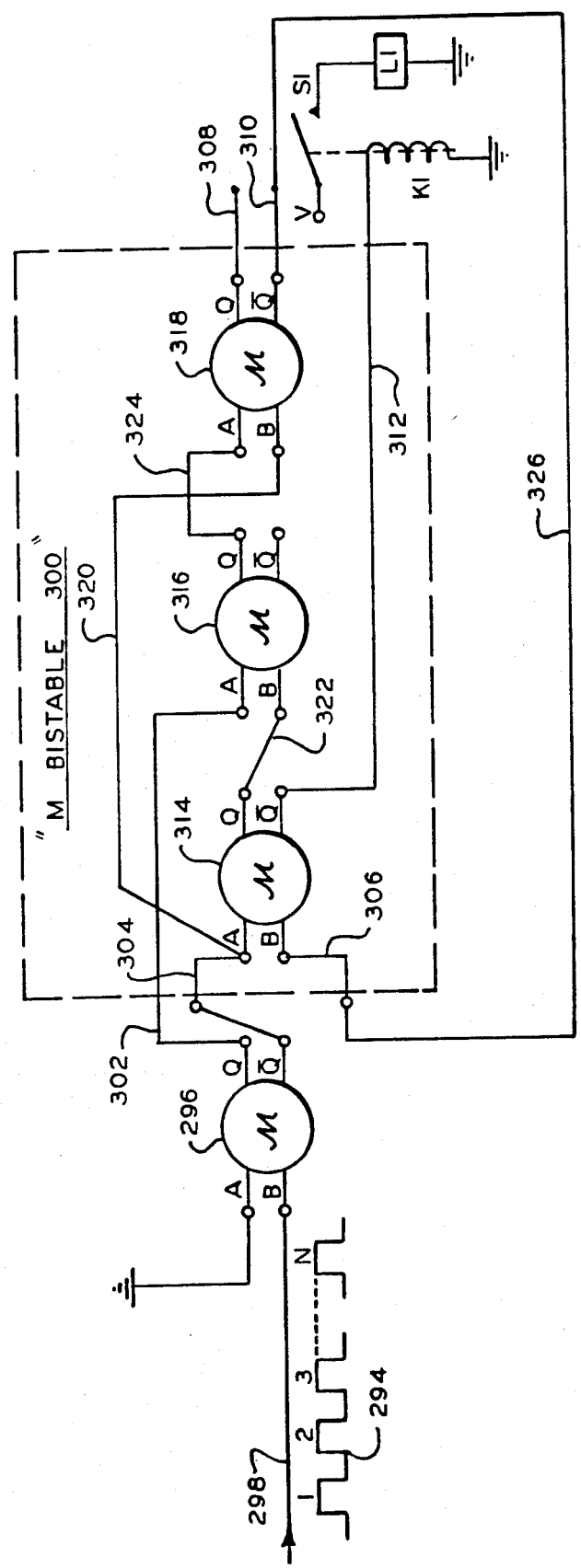
FIG. 17 shows an arrangement of M Circuits in a linear array, referred to as an M Bistable Circuit.

Another form of basic arrangement of M Circuits in a linear array is shown in FIG. 17. As shown therein, a pulse train 294 of positive pulses 1, 2, 3 . . . , N, is applied on line 298 to the B input of M296, and the A input is grounded. This is an M inverter of the type described above in connection with FIG. 10A. Similarly, the connection of FIG. 10B above could be employed; however, in this connection an additional input drive power unit would be required.

FIG. 17 includes an M Bistable 300, indicated in dotted lines, which is provided with three inputs 302, 304, and 306, respectively. Input lines 302 and 304 are always provided with signals which are complementary relative to each other when the Bistable Circuit 320 is operated in the serial mode. Input line 306 is a reset line. Similarly, the M Bistable Circuit 300 is provided with output lines 308, 310, and 312. Outputs 308 and 310 are the Q and $\overline{Q}$ outputs of M318. Output line 312 is the $\overline{Q}$ output terminal of M314 and serves as the Bistable or latch output line. Other input and output lines may be connected, as desired, to the input and output terminals of M314, M316 and M318.

In FIG. 17, the Q output of M296 is connected via line 302 to the A input of M316. The $\overline{Q}$ output of M296 is connected via line 304 to the A input of M314 and also via line 320 to the B input of M318. Input line 306 is connected to the B input of M314. The Q output of M314 is connected via line 322 to the B input of M316. M314 and M316, as shown, comprise the circuit shown and described with reference to FIG. 13G above. The Q output of M316 is connected via line 324 to the A input of M318. M316 and M318, as shown, comprise the circuit shown and described with reference to FIG. 13E, above. In this connection, the output 310 of the M Bistable Circuit 300 is connected to the reset input line 306 to the B input of M314 by a line 326.

By way of example, the output line 312 of M Bistable Circuit 300 is shown connected to a relay K1 whose contact S1 will apply the Voltage V to activate a load L1 when output 312 of M Bistable Circuit 300 is "1". Such relays are commercially available which will operate directly from the power levels of micro circuits. Also, the present state of the art provides micro circuits which will directly power a load and other electrical power loads.

The precise understanding of the operation of M Bistable 300 is fundamental to the understanding of M Circuit systems in general and, therefore, a detailed description of the operation of M Bistable 300 will be provided with reference to a timing chart for the M Bistable 300. This timing chart is shown in FIG. 18.

Figure 18:
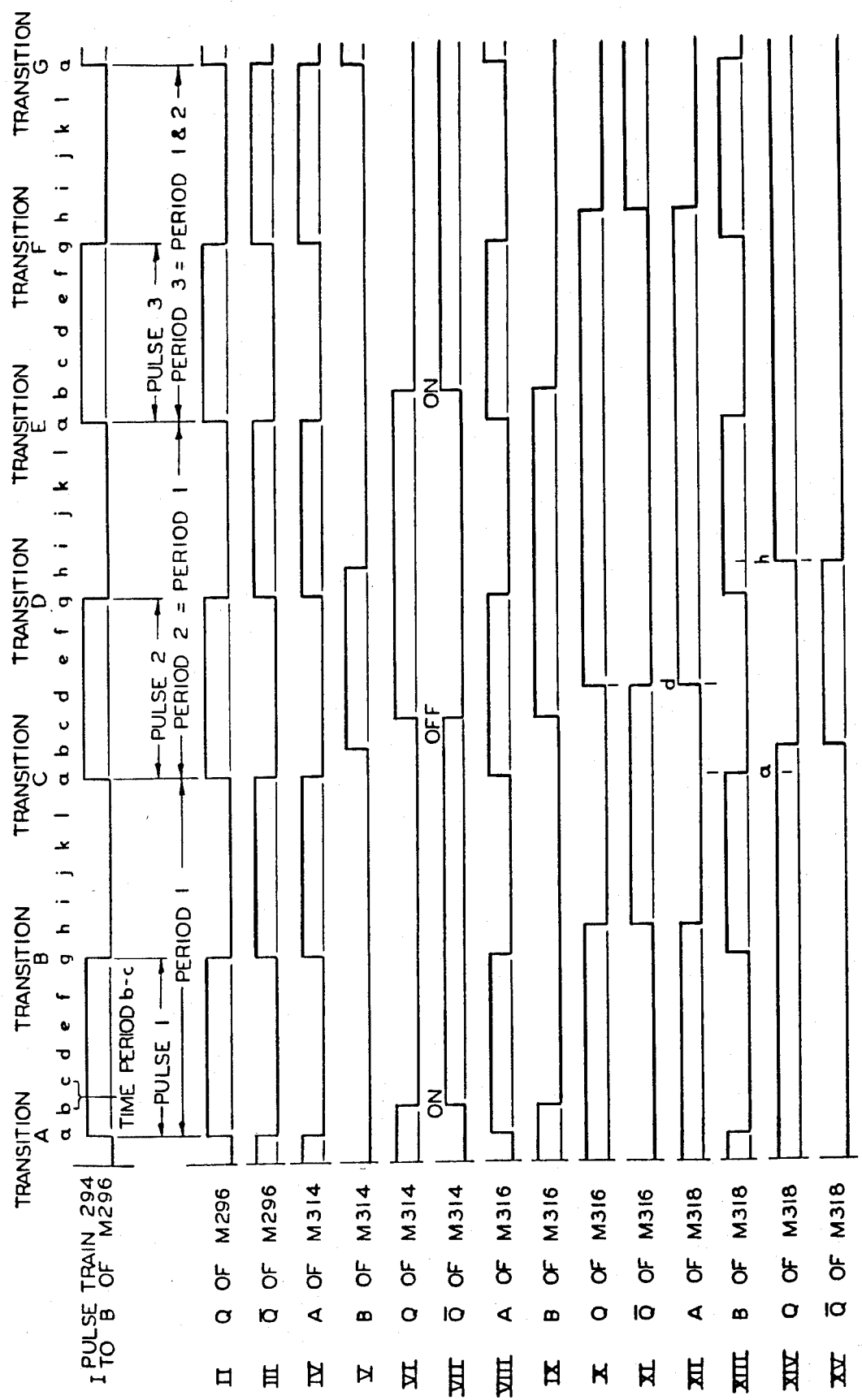
FIG. 18 is a timing chart for illustrating the operation of the M Bistable Circuit of FIG. 17.

The general operation and function of the system can be understood by observing row I and row VII of the timing chart shown in FIG. 18. At time a, the leading edge of pulse "1" arrives with transition A. The times a to b, b to c, and so on, represent the time it takes for an M Circuit to set or to reset. This is the M Circuit transition time. Referring to rows VI and VII, after one M Circuit transition time from the time the leading edge A of pulse "1" arrives, M314 has set as indicated at time b, and the relay K1 activates to place the load L1 in the on condition. On the arrival of the pulse 2 with transition C, M314 will be reset, as described below, and two M transition times later, to be described below, load L1 will be placed in the off condition. This process is repetitive. Thus, the first and all succeeding pulses, 1, 3, 5 . . . N, where N is odd, will place load L1 in the on condition, and the second and all succeeding pulses 2, 4, 6 . . . N, where N is even, will deactivate load L1. Therefore, this arrangement is an M Circuit Bistable or latch.

The detailed description of the operation of M Bistable Circuit 300 will now be provided.

Input terminals 302 and 304 of M Bistable 300 are connected to the Q and $\overline{Q}$ terminals M296, respectively. The input B of M296 is the pulse train 294 as shown in row I of FIG. 18. The Q and $\overline{Q}$ outputs of M296 are shown in row II and row III, respectively.

While the rows II and III of FIG. 18 represent and Q and $\overline{Q}$ output levels of M296, it is to be noted that the M Circit transition time associated with M296 is not shown in FIG. 18 since the timing chart is primarily intended to illustrate the operation of, and transition times, associated with the M Circuits M314, M316 and M318 of the M Bistable Circuit 300. The pulse train 300 is only illustrative as an input signal which produces changes in the input driver M Circuit M296 providing the Q and $\overline{Q}$ signals, as shown, to the M Bistable Circuit 300.

Initially, the B input of M314 will be assumed to be "0" as shown in row V, then the $\overline{Q}$ output of M296 goes to "0", and the A input of M314 goes to "0" as shown in row IV at transition time A. The inputs to M314 are now A="0", B="0", and M314 will set with its Q="0", and its $\overline{Q}$="1", at one transfer time later at time b as shown in rows VI and VII, respectively. Load L1 is now turned on as described above.

At this time b, the B input of M316 is "0" as shown in row IX and, therefore, M316 is enabled to set when the A input of M316 shown in row VIII goes to "0". This will occur at time g or transition B of pulse "1". At this time g, the input A and the input B of M316 will both be "0" as shown. Thus, M316 is setting and in one M transfer time, at time h, the Q output of M316 will be "0" and the $\overline{Q}$ output will be "1" as shown in row X and row XI, respectively.

This "0" at the Q output of M316 will instantly appear at the A input of M318 enabling such M Circuit to be set if its B input is a "0". However, at the time h, the B input of M318 is a "1" as shown in row XIII since $\overline{Q}$ of M296 and therefore A of M314 are "1" at time h. However, at transition C, which is the leading edge of pulse 2 at the time a, the B input of M318 will be "0" and M318 will begin to set. M318 will be set at time b when its Q output will be "0" and its $\overline{Q}$ output will be "1" as shown in rows XIV and XV, respectively. Due to the feedback connection line 326, the B input of M314 will also be "1" as shown in row V at time b and the A input will be "0" as shown in row IV. The "1" at the B input of M314 will begin to reset it at time b; and at time c, M314 will be reset placing the Q output of M314 at "1" and the $\overline{Q}$ output of M314 at "0" as shown in rows VI and VII, respectively. The "0" at the $\overline{Q}$ output of M314 will disable relay K1 via line 312, and consequently, load L1 will be deactivated.

At time c during pulse 2, the "1" at the Q output of M314 will, via its line 322 connection to the B input be reset at time d with its Q output a "1" and its $\overline{Q}$ output a "0" as shown in rows X and XI, respectively. The "1" at the Q output of M316 will appear through the line 324 as a "1" at the A input of M318. This "1" at the A input of M318 will hereby place M318 in memory, as described above, at the time d since the B input of M318 is a "0" at this time as shown in row XIII.

Thus, the first transition A of pulse "1" caused load L1 to be activated and the first transition C of pulse 2 caused load L1 to be deactivated.

Continuing the description of the operation of the M Bistable Circuit 300, at transition time D, M296 will be set and the "1" at its $\overline{Q}$ output will be applied via lines 304 and 320 as a "1" on the B input of M318, as shown in row XIII, and M318 will reset by time h providing a "1" at its Q output and a "0" at its $\overline{Q}$ output, as shown in rows XIV and XV. The "0" at the $\overline{Q}$ output of M318 will enable M314 to set through feedback line 326. However, since the A input of M314 is a "1" as shown in row IV, M314 will be placed in memory with its Q output a "1" and its $\overline{Q}$ output a "0", as shown in rows VI and VII. When the leading edge or transition E of pulse 3 arrives at the next time a, the A input of M314 will be "0" and M314 will set as described above in connection with the description of transition A of pulse "1" above, and the process described above is repeated.

Thus, odd numbered pulses of the pulse train 294 will activate load L1 while even numbered pulses of pulse train 294 will deactivate load L1.

It is to be noted that the transition A of pulse train 294 set M314, the transition B of pulse train 294 set M316, the transition C of pulse train 294 set M318, and transition D of pulse train 294 produced no effect with respect to the setting of any one of these M Circuits. The degree of control over and effective use of the time between such transitions will become clearer from the description hereinbelow. It is also to be noted that the time of the arrival of transitions A, B, C, D . . . is of no importance to the system. Although the pulse periods are shown in FIG. 18 as being constant, this is not necessary as may clearly be seen by shifting the transition points forward or backward in time, as desired. Thus, the circuit shown is a two binary state asynchronous system operating on data, input data change, or transitions.

Figure 19:
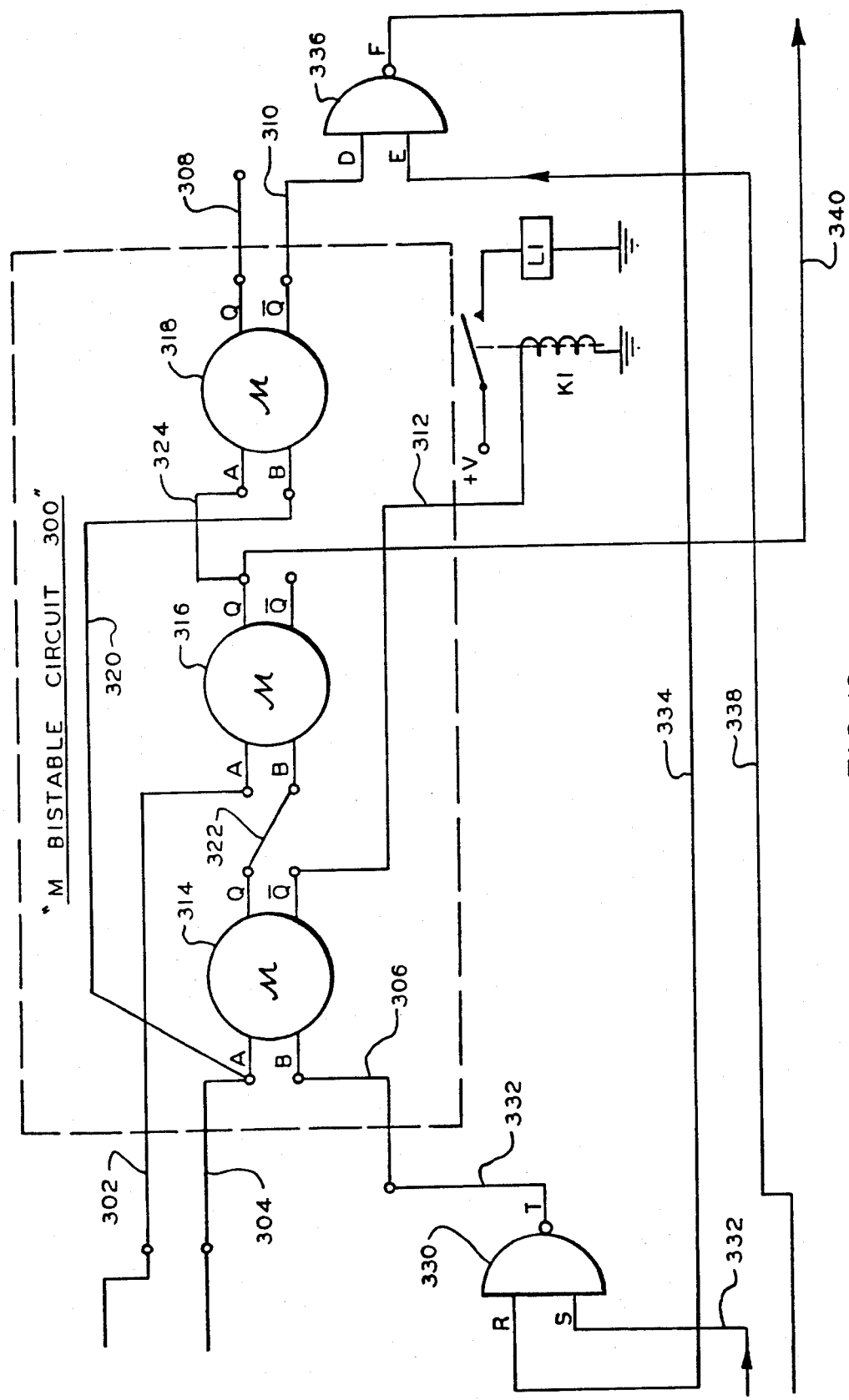
FIG. 19 shows an interconnection of class 1 and class 2 types of gates with the M Bistable Circuit shown in FIG. 17.

In FIG. 19, there is shown the interconnection of a class 1 type of gate and a class 2 type of gate with the M Bistable Circuit 300 described with reference to FIGS. 17 and 18 above. It is noted that the detail numbers for the circuit elements of, and lines into and out of M Bistable Circuit 300 are identical with those used in FIG. 17. As described above in connection with the gates of FIG. 11, a class 1 gate 330 normally has its inputs R and S as a "1" and its output T is a "0" thereby applying a "0" to the line 306 into input B of M314. This enables the Bistable Circuit 300 to provide a "1" at output line 312 from M314 if line 304 to its A input is low. The S input of gate 330 is shown connected to an input line 332 which provides an input which is normally a "1". If the input line 332 of class 1 gate 330 goes to "0", then the T output goes to "1", and M314 and the M Bistable Circuit 300 is reset, i.e., output line 312 is "0". Also, data is locked out of M Bistable Circuit 300 as long as the input line 332 is a "0".

The R terminal of gate 330 is connected via line 334 to the F output of a class 2 gate 336. The D input of gate 336 is connected to the $\overline{Q}$ output of M318 by line 310. The E input of gate 336 is connected for receiving an enable signal on line 338. The output Q of M316 is connected to an output line 340. In this connection, a change in output 310 of M Bistable Circuit 300 from a "0" to a "1" will not reset M Bistable Circuit 300 unless the enable line 338 is enabled by a "1". More particularly, when the gate 336 is enabled, a "1" on line 310 will provide a "0" at the F output of gate 336 which in turn causes the gate 330 to provide a "1" on line 306 to reset the M Bistable Circuit 300.

This and various other arrangements of gates described above may be used to selectively feed data to M Circuit systems while directly translating system specifications into M Circuit hardware, thus providing a reduction in system specification writing time and engineering design time.

In FIG. 20A, there is shown another useful linear array of M Circuits. An input driver M Circuit 342 has its A input at ground voltage and its B input connected to input line 344. The operation of M342 is as described above with reference to FIGS. 10A and M296 of FIG. 17. A linear array of four M Circuits M346, M348, M350 and M352 is indicated by dotted line block 354. The A inputs of M Circuits M346 and M350 are connected together by line 356 as well as being connected to the $\overline{Q}$ output of M342. The A inputs of M348 and M352 are connected together by line 358 which is also connected to the Q output of M342. The Q outputs of M Circuits M346, M348 and M350 are connected via lines 360, 362 and 364 to the B inputs of M348, M350 and M352, respectively. The Q and $\overline{Q}$ outputs of M352 are shown as output lines 366 and 368 leading out of the four M linear array block 354. Also, the $\overline{Q}$ output of M350 is connected to an output line 370. The $\overline{Q}$ output of M346 is provided on output line 376 to relay K1 which supplies a load L1 with power V via its contacts. The $\overline{Q}$ output of M352 is fed back to the B input of M346 by a line connection 372 which is external to the four M linear array block 354.

A simplified time chart is shown in FIG. 20B wherein row I represents a pulse train 374 input to the B input of M342, and row II represents the $\overline{Q}$ output of M346 which activates the relay K1 via the line 376. Assume the system is reset and the B input of M346 is "0", and the leading edge a of pulse "1" of the train 374 will set M346 by the "0" applied to its A input on line 356. As is now well understood, the Q output of M346 will enable M348 to be set by a "0" at the A input of M348.

Continuation of this enabling process will not be further described. On transition b of pulse "1", M348 will set, on transition c, M350 will set, and on transition d, M352 will set, thereby resetting M346, M348, M350 and M352 in a ripple-like fashion.

It is to be noted that when the reset pulse on line 372 arrives at the B input of M346 upon the setting of M352, the A input of M346 is a "1". Therefore, M346 will remain reset in the memory state even though M352 resets and presents a "0" at the B input of M346. Then, at transition e, M346 will set and the process described above will repeat. Accordingly, the operation of the load L1 by the $\overline{Q}$ output of M346 is repeated as shown in FIG. 20B at row II.

At this time, there is to be noted a difference between the operation of the circuit of FIG. 20A and the circuit shown in FIG. 17 above. In the circuit of FIG. 17, when the reset for M314 arrived, the A input of M314 was "0". Therefore, it was necessary to provide an M Circuit arrangement of the type shown in FIG. 17 or of the type shown in FIG. 13B above, such that the reset input at B of M314 is a "1" as long as the A input of M314 is "0". In these types of circuits, the circuit of FIG. 13B can be used in place of the M318 of FIG. 17 to insure that M314 does not set while its A input is a "0". In general, it may now be observed that linear arrays of M Circuits of this type require, at the last stage, a circuit of the type used in FIG. 17 if resetting is to occur on an odd pulse transition but may have at the last stage a circuit of the type shown in FIG. 20A if resetting is to occur on an even pulse transition.

Figure 21:
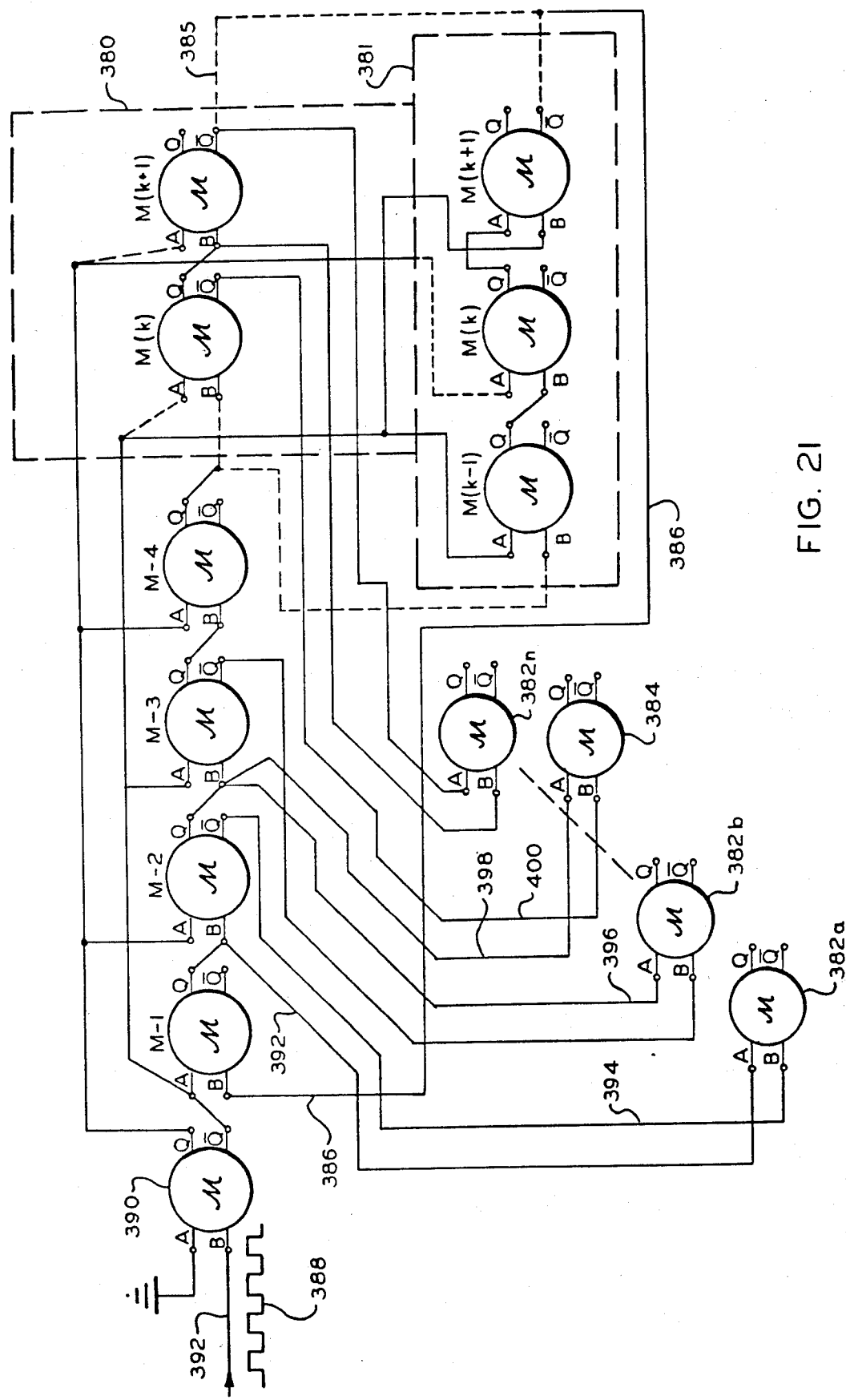
FIG. 21 shows a generalized linear array of M Circuits and illustrates a method of connecting a linear array having an odd or an even number of M Circuits.

Referring to FIG. 21, there is shown a generalized linear array of M Circuits. The output block 380 and output block 381 are the even and odd output stages shown in FIGS. 20A and 17, respectively. As described, an even output stage is the termination of an even number of M stages wherein the last output stage is set by an even number transition. Similarly, an odd output stage is represented by an odd number of M stages wherein the last output stage is set by an odd number transition. The linear array includes a number of M Circuits M1, M2, M3, M4, and so on. Additionally, there is also shown a series of M Circuits M382a through M382n having their A and B inputs connected to the Q output and $\overline{Q}$ output of a respective M Circuit M2 through M(k+1).

Output block 380 shows an output structure of the type described above in FIG. 20A. Here, M(k) is an odd stage or odd transition setting M Circuit, and M(k+1) is an even stage or even transition setting M Circuit. That is, the kth M Circuit will set on an odd transition and the (k+1)th M Circuit will set on an even transition. The block 381 shows an output arrangement in which the M(k−1) is an odd stage or transition setting M Circuit M(k) is even; and M(k+1) is an odd stage or transition setting M Circuit, as described above with reference to FIG. 17.

Thus, the M Circuit linear array of FIG. 21 illustrates a method of connecting M Circuits having an odd or an even number of M Circuits arranged in a linear array. In the case of a system having an odd number of M stages, as shown in FIG. 17, the A input of the first M stage M1 is a "0" during reset and, therefore, the first M stage would set during the reset operation if the B input of the first M stage is not held at "1" while its A input is a "0". The $\overline{Q}$ output of M(k+1) of block 381 provides a "1" on the feedback line 386 to the B input of M1 in this case while the A input of M1 is a "0". This "1" at the B input of M1 prevents M1 from being set when the final M of the array is reset. Therefore, it is necessary to keep the last M Circuit of the linear array set as long as the A input of M1 is a "0". This is achieved by M(k+1) of block 381 which is held by the "0" at its B input, this "0" being the same "0" which is at the A input of M1.

If the number of M stages is an even number, as illustrate by the block 380 in FIG. 21, then when the (k+1) M Circuit sets, its $\overline{Q}$ output via dotted line connection 385 and line 386, places a "1" at the B input of M1 thereby resetting the entire system. When the (k+1) M Circuit of block 380 becomes reset, its $\overline{Q}$ output goes to "0" and M1 goes to memory reset. However, the "1" remains at the A input to M1 so that M1 does not set at this time when M(k+1) resets.

In even transition linear arrays of M Circuits, if it is desired that the last M, M(k+1) of the array, remain set between the last even transition of the input data or pulses, and the first transition of the next data or pulse cycle, an output block of the type of block 381 is required to keep M(k+1) set during this transition interval.

In the linear M Circuit system of FIG. 21, when the first transition of pulse train 388 arrives on line 392 at the B input of the input M Circuit M390, M1 will set. This will provide a "0" on line 392 to the A input of M382a. Since the B inputs of M382a is "0" from the line 394 connected to the $\overline{Q}$ output of M2 which is reset, then the M382a will set.

When the second transition of pulse train 388 arrives, M2 will set. This will reset M382a via line 394, and will set M382b via line 396, in the same manner as described for M382a. Stated in general terms, the nth input transition will set M382n, and the (n+1)th transition will reset M382n. Thus, the time intervals between transitions are well defined and clearly known.

There is also shown in FIG. 21 by way of example, an M Circuit 384 having its A and B inputs connected respectively by lines 398 and 400 to the B input of M3 and the $\overline{Q}$ output of M(k). In this example, M384 will set on the 3rd transition of pulse train 388 and will reset on the kth transition of pulse train 388. Thus, any information desired concerning the transition status or pulse status of pulse train 388 is directly available.

Figure 22:
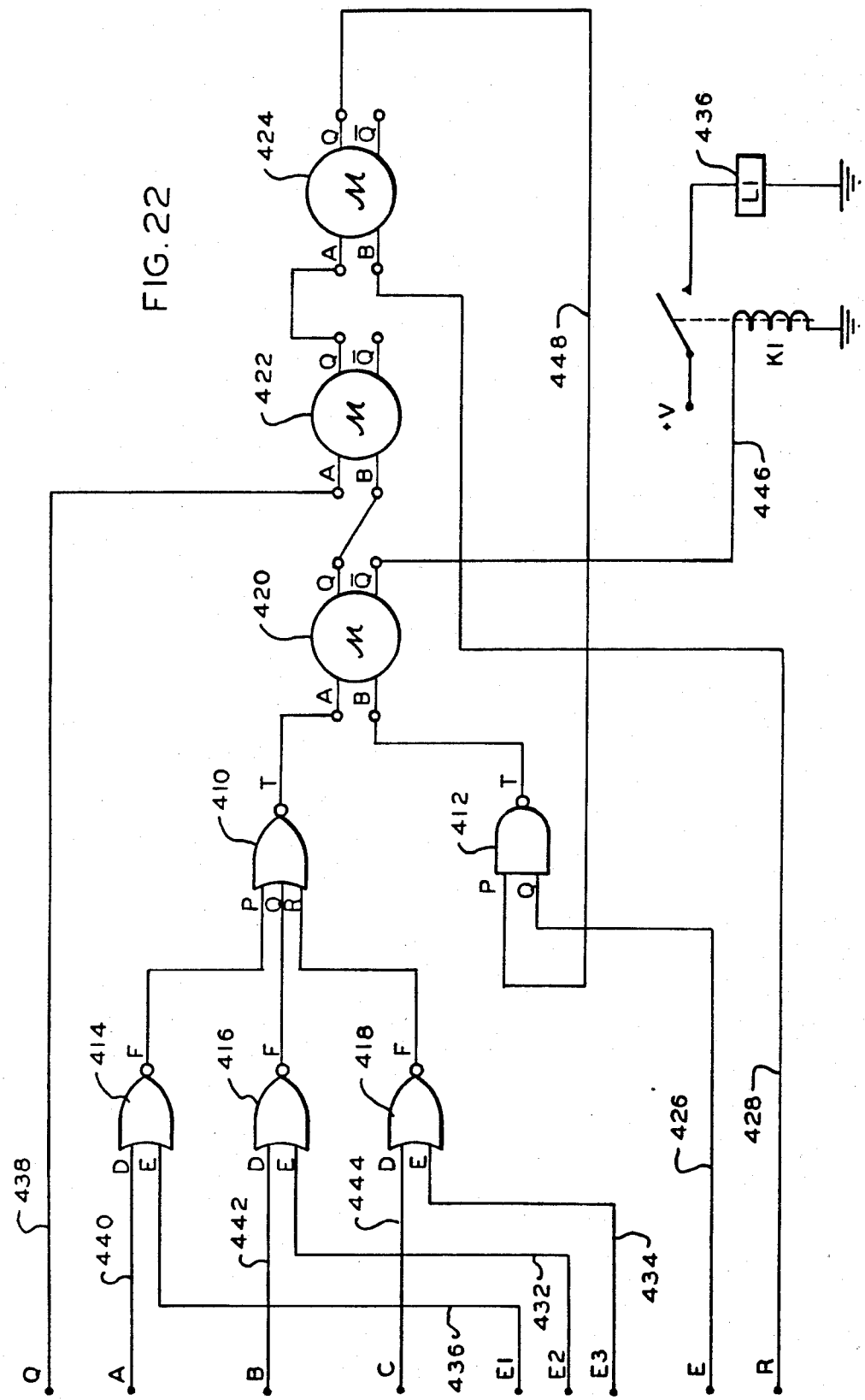
FIG. 22 shows a linear array of M Circuits connected to class 1 and class 2 types of gates.

In FIG. 22 there is shown by way of example another useful interconnection of class 1 and class 2 gates used with M Circuits. Here, the class 1 gates are shown as NOR gate 410 and NAND gate 412. The class 2 gates are the NOR gates 414, 416, and 418. The gates are connected to the input terminals of M420 of a 3M linear array also comprising M422 and M424.

Assume that the gate and M system shown is in reset condition. If input enable line 426 is "0", the B input of M420 is provided by gate 412 with a "1" and no data may enter the system. If the enable line 426 is a "1", gate 412 is enabled and data may enter the system if line 428 is "0" and $\overline{Q}$ of M424 is "1". Further, under the conditions for data to enter the system, data enable entry lines 430, 432 and 434 must be enabled with a "0" in any combination. Thus, if other gates are added as one should be aware of from the discussion of class 1 and class 2 gates above, there is an infinite number of possibilities for setting and resetting M420 which activates a relay K1 and provides power to a load L1, indicated by the numeral 436.

A first form of operation of the circuit may be described by assuming that input line 438 to the A input of M422 is "0", line 426 is "1", M420 is reset and M424 is reset and enabled. Input lines 440, 442 and 444 feed data into the gates 414, 416 and 418, respectively. Now, if line 432 is a "0", a "0" on line 442 will result in a "0" at the A input of M420 and set M420 as described above, and relay K1 will activate load 436 via an output line 446 from $\overline{Q}$ of M420. If, now, a "0" appears on line 438, M422 will set enabling M424 to set as described above.

Resetting of M420 may now be achieved by a "0" on line 426, or by a "0" on line 428 which will set M424 and in turn will will reset M420 through the action of feedback loop 448 connected from the $\overline{Q}$ output of M424 to the P input of gate 412.

Various other combinations of modes of operation are possible for the system of FIG. 22. For example, enable line 432 may be a "1" and line 430 a "0". Thus, another flexible linear M Circuit data separator or processor is provided by this system.

LINEAR M CIRCUIT SHIFT REGISTERS

Figure 23:
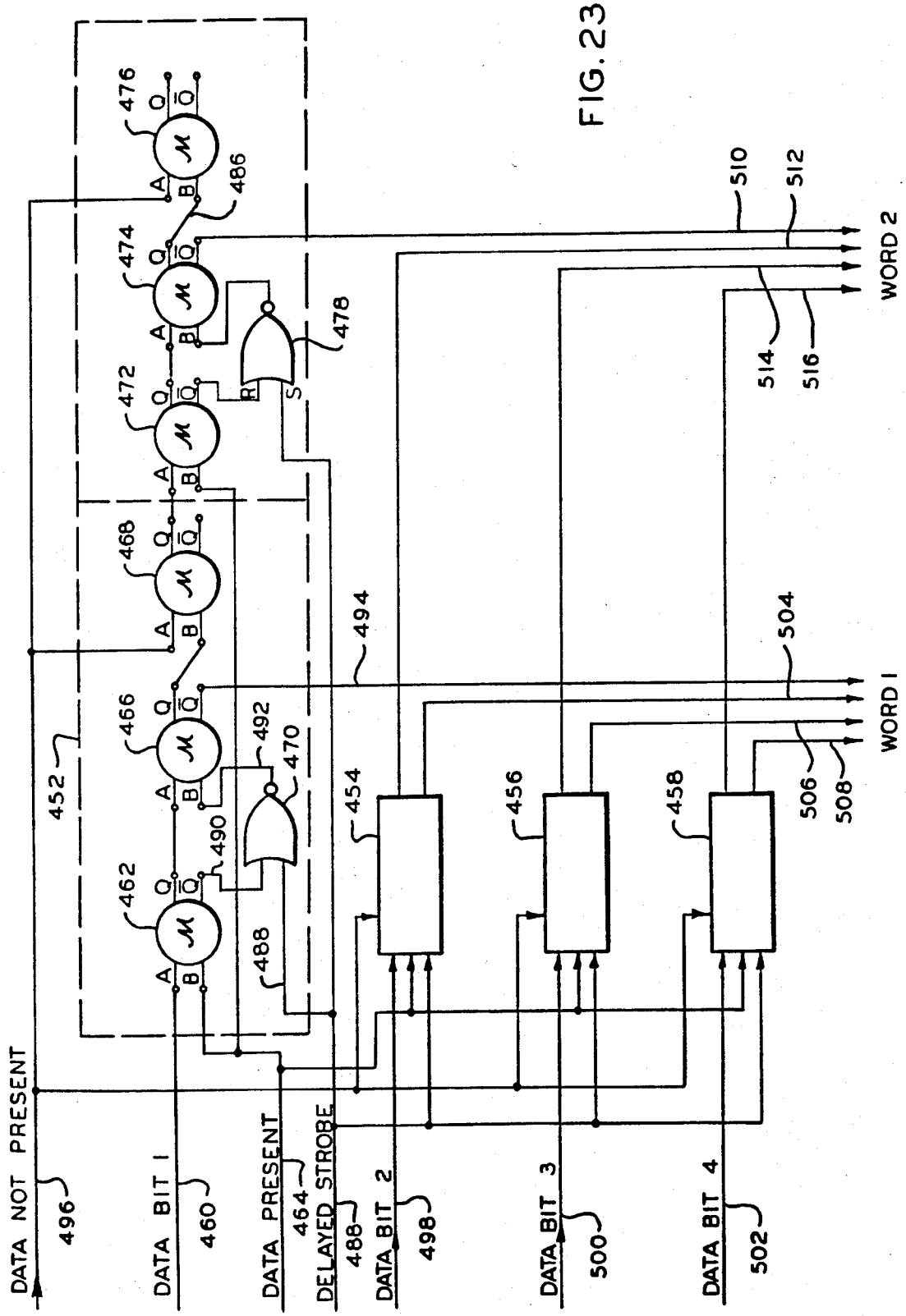
FIG. 23 shows a linear array of M Circuits configured to provide a shift register.

Linear arrays of M Circuits may also be configured as shift registers. FIG. 23 illustrates the use of four linear M Circuit arrays to provide a shift register for processing parallel binary words of four bits each. Only one serial array, indicated by the dotted block 452, which is associated with data bit 1 of the parallel binary word, is shown in detail.

The serial arrays 454, 456 and 458 are identical to serial array 452 and are associated with the data bits 2, 3, and 4, respectively. Data bit 1 input line 460 is connected to the A input of M462. The B input of M462 is connected to a data present line 464 at the input to the shift register. The pulses on these and the other input lines are shown in the timing chart of FIG. 24, and a method by which these pulses may be generated will be described below. Serial array 452 comprises two shift register stages, the first stage including M462, M466 and M468 and a NOR gate 470. The second stage includes M472, M474, M476 and a NOR gate 478. The Q output of M462 is connected via line 480 to the A input of M466. Similarly, the Q output of M468 is connected via line 482 to the A input of M472. The $\overline{Q}$ output of M462 is connected via NOR gate 470 to the B input of M466. The $\overline{Q}$ output of M472 is connected via NOR gate 478 to the B input of M474. Also, the Q outputs of M466 and M474 are connected to the B inputs of M468 and M476 via lines 484 and 486, respectively.

Figure 24:
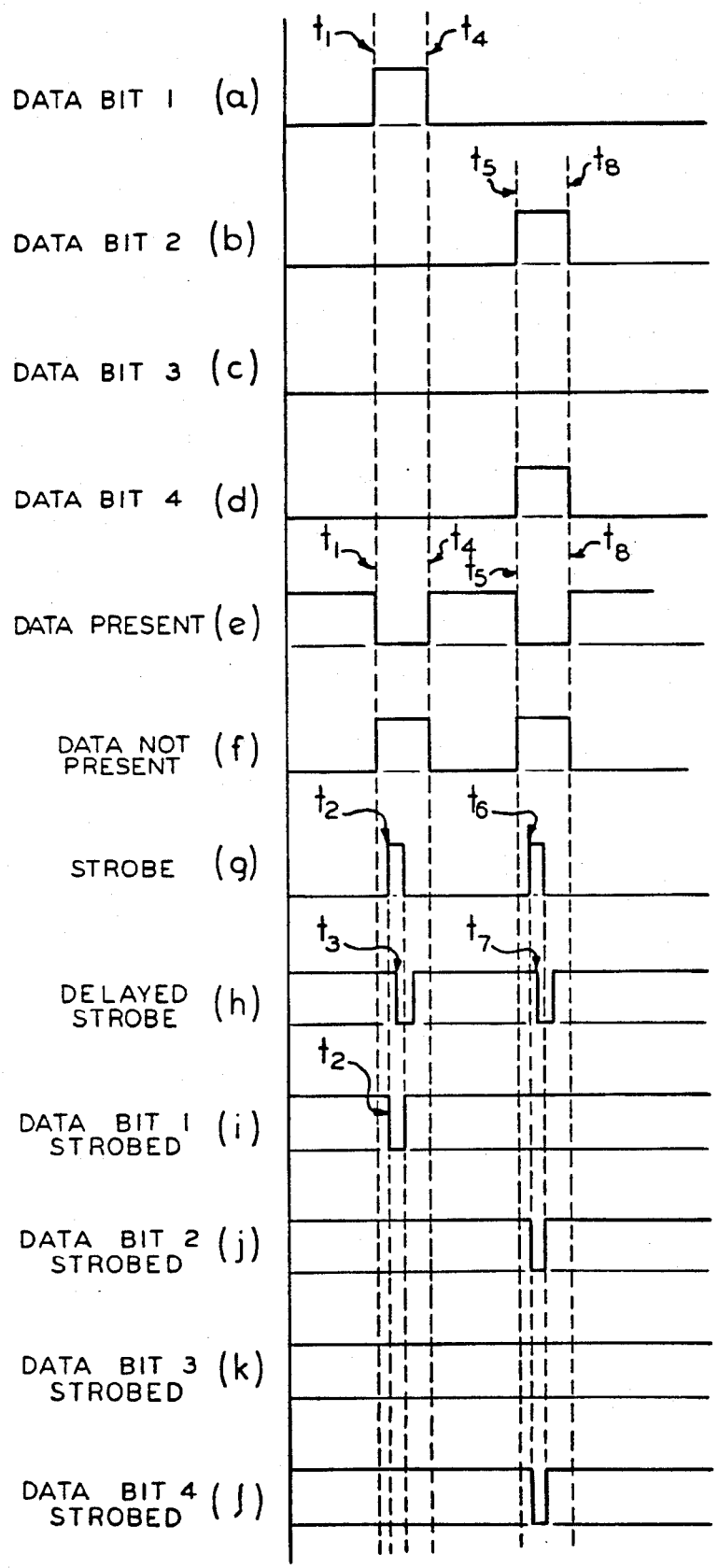
FIG. 24 shows waveform diagrams for illustrating the operation of the shift register of FIG. 23.

For the present, as shown in FIG. 24, assume that data bit 1 arrives at time $t_1$. The presence of data will cause the data present line 464 to be at "0", as shown in row e of FIG. 24. After a data settling time has passed, the data will be strobed by the strobe pulse shown in row g, and since bit 1 data is present, a "0" will occur on data bit line 460 to the input A of M462 thereby setting M462. The Q output of M462 is now "0" and provides this "0" to the A input of M466. This strobed data bit 1 is shown in row i of FIG. 24.

M466 will now set because its B input is a "0". This is true because the input line 488 of gate 470 is a "1" and the output line 492 of gate 470 is a "0". Input line 488 is a delayed strobe line which carries the signal shown in row h of FIG. 24. The delayed strobe first occurs at time $t_3$. The $\overline{Q}$ output of M462 will provide a "1" on line 490 to gate 470, thereby maintaining the output of gate 470 at "0" and also a "0" at the B input of M466, during the occurrence of the "0" on the delayed strobe pulse input to gate 470 via line 488. In this manner, the delayed strobe pulse input produces no effect.

The data is taken out of the $\overline{Q}$ output of M466 on a line 494. Since M466 is set, its $\overline{Q}$ output will be "1" and a "1" will appear on data output line 494. This may be used as a data indicator or controller output line. Thus, with a "0" on data bit 1 line 460, after the strobe, a "1" output will be present at the second M Circuit of the first stage of the shift register, i.e., at the $\overline{Q}$ output of M466.

When the input data, shown in row a, is no longer present at time $t_4$, line 464 will be a "1" resetting M462. However, M466 will not reset since the delayed strobe line 488 provides a "1" via line 488 at one input of NOR gate 470, and thus the B input of M466 is a "0". At the time data is not present, M468 will set since its B input is enabled by M466 and its A input is now "0", since there is a "0" on the data not present line 496, shown in row f connected to the A input of M468.

Assume that the next time data is present that data bit 1 is not present and data bits 2 and 4 are present as shown in rows b and d, respectively, between times $t_5$ and $t_8$. The "0" on data present line 464 will be applied to the B input of M472 to enable it to set, and M472 will set since M468 is set. When M472 sets, M474 will set by the same manner described for M466. Now, the data which was present at M466 has been transferred to M474 and a "1" will be provided on word "2" output line 510. When the strobe appears at time $t_6$, M462 will not set since the data bit 1 line 460 will be a "1". This "1" at the A input of M462 will keep M462 in memory reset. When the delayed strobe "0" appears on line 488 at time $t_7$, at the input of NOR gate 470, NOR gate 470 will output a "1" since both its inputs are "0", thereby resetting M466 and M468.

During this second data input cycle, the strobe pulse will have input a "0" on data bit 2 line 498, or on data bit 3 or 4 lines 500 and 502, respectively. This would have set the first M of register 454, 456 or 458 and the data entry process is the same as described above for data bit 1 in the serial array 452.

In the particular second data input cycle shown in FIG. 24, the specific data input would have been data bit 2 and data bit 4 information and there will be a "1" output on word 1 output lines 504 and 508. Also, there will be a corresponding "0" output on word 2 output line 510. The word 1 output lines are indicated by numerals 494, 504, 506 and 508. The word 2 output lines are indicated by numerals 510, 512, 514 and 516. Now, at the time $t_8$ shown in FIG. 24, when no data is present, the M Circuits corresponding to M462 in the serial arrays 454 and 458 will reset, as will M472 in serial array 452. Also, the corresponding M Circuits to M468 in the serial arrays 454 and 458 will set, as will M476 as described above, with reference to M468.

The M Circuits M468 and M476 are not necessary but can be used as buffers to prevent inputting unwanted data.

LINEAR PULSE GENERATING AND WAVE SHAPING

Figure 25A:
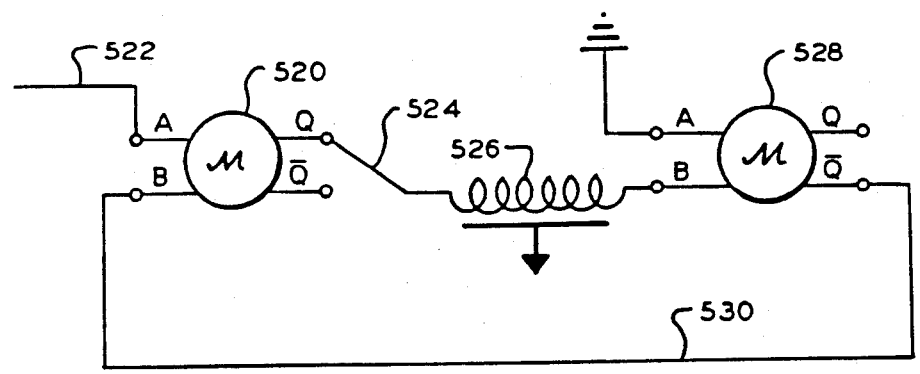
FIG. 25A shows a form of M Circuit oscillator.

In FIG. 25A, there is shown another arrangement of M Circuits. As shown, the A input of M520 is connected to an input line 522 which will initially be a "1". The Q output of M520 is connected via line 524 to the input of delay line 526. The output of delay line 526 is connected to the B input of M528. The A input of M528 is placed at logic "0", shown here as a ground connection. The $\overline{Q}$ output of M528 is connected via feedback line 530 to the B input of M520.

M Circuits 520 and 528 will be initially reset. To prove this, assume that M528 is set. Then, the B input of M520 is a "1" and the A input of M520 is a "1". Therefore, M520 is in reset and the Q output of M520 is a "1" and, at this time or within the time of delay line 526, the B input of M528 will be a "1". This "1" at the B input of M528 will reset it and provide a "0" at its $\overline{Q}$ output and, consequently, a "0" at the B input of M520. M520 will have a "1" at its A input, as described above, and a "0" at its B input and, thus, will be in memory reset with a "1" at its Q output. Therefore, the above discussion proves that the B input of M520, in the non-oscillating quiescent state, cannot be a "1".

Figure 25B:
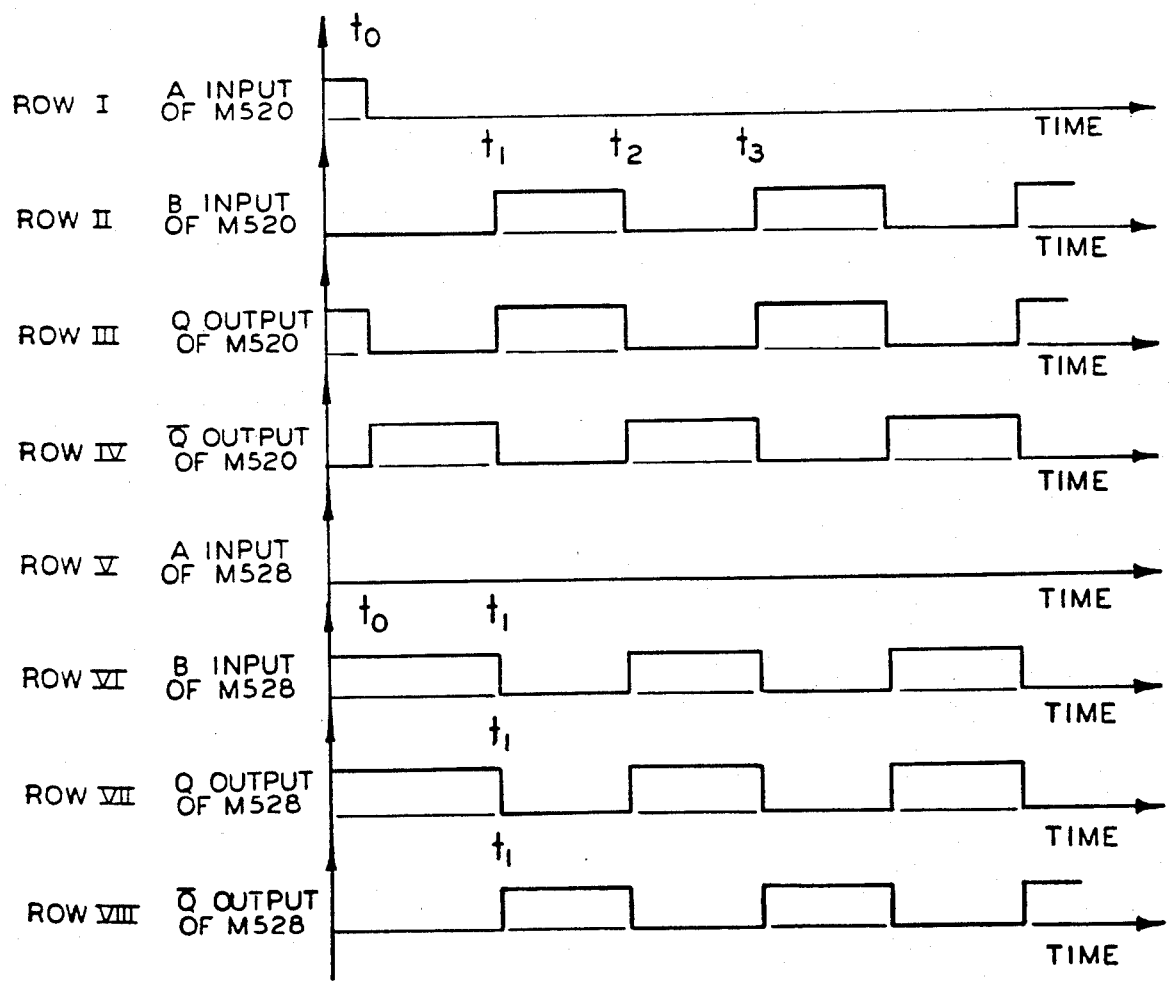
FIG. 25B shows waveform diagrams illustrating the operation of the oscillator of FIG. 25A.

As shown in the timing chart of FIG. 25B on row I, assume that a "0" arrives on line 522 at the A input of M520 at time $t_o$. The B input will be a "0" as shown in row II and as described above. Therefore, M520 will set at time $t_o$ as shown on row III and row IV of the timing chart so that the Q output of M520 will be a "0" and the $\overline{Q}$ output will be a "1". After the time of the delay line 526, the B input of M528 will be a "0". This is shown in row VI at time $t_1$ following the delay time which is equal to $t_1$ minus $t_o$. At this time, M528 will set and its Q output will be "0" and its $\overline{Q}$ output will be "1" as shown on rows VII and VIII. The "1" at the $\overline{Q}$ output of M528 will appear at the B input of M520 and reset M520, as shown on rows II, III and IV at time $t_1$. After the time of delay line 526, the "1" Q output of M520 will appear at the B input of M528 at time $t_2$ to reset it, and the Q and $\overline{Q}$ outputs of M528 will be as shown on rows VII and VIII of the timing chart. The process described above will continue as long as the A input of M520 is "0". This is another form of M Circuit oscillator with frequency having a period of twice the time delay of delay line 526. When the input on line 522 goes to a "1", the oscillations will stop if or as soon as the B input of M520 is a "0" as described above for the non-oscillating quiescent state.

It is to be noted that any type of feedback circuit may replace the delay line 526, as was discussed in reference to the feedback circuit 26 of FIG. 10E.

Figure 26A:
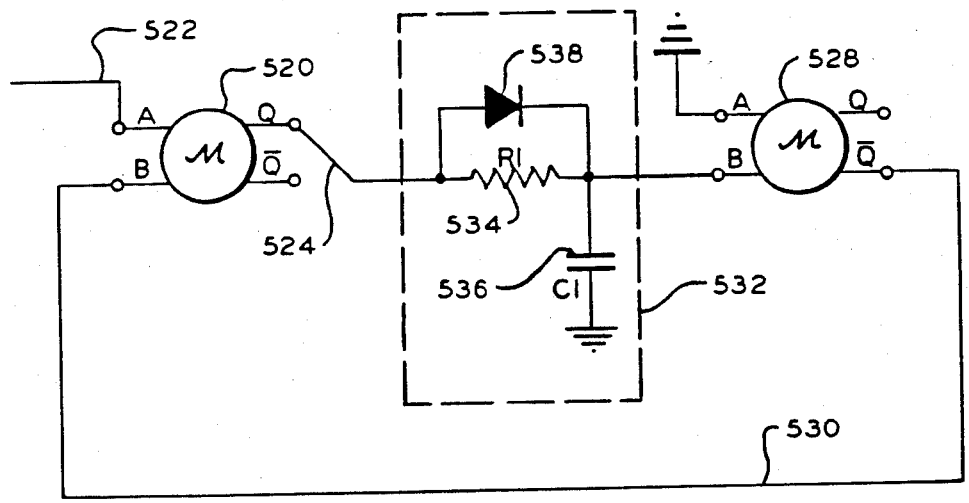
FIG. 26A is a form of a one shot pulse generator comprised of M Circuits.
Figure 26B:
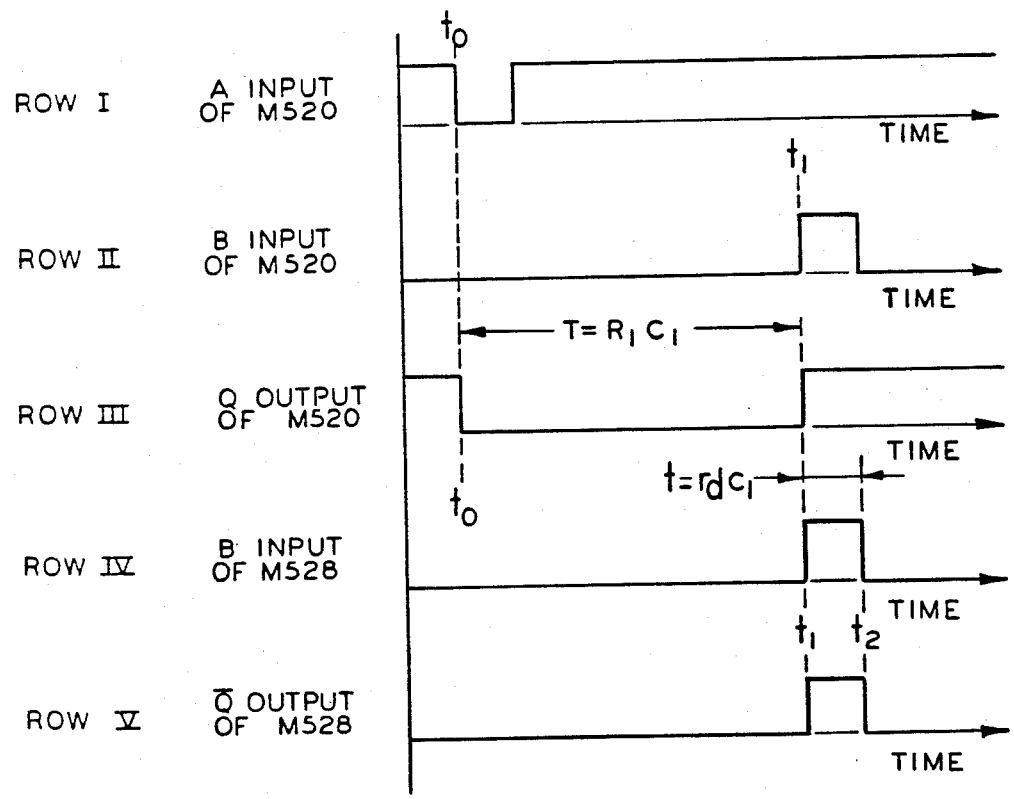
FIG. 26B shows waveform diagrams illustrating the operation of the circuit of FIG. 26A.

In FIG. 26A, there is shown a circuit which is identical to the circuit of FIG. 25A except that the delay line 526 is substituted by an integrator 532 comprising resistor 534 and capacitor 536, with a diode 538 across resistor 534 as shown. This may be considered to be a one way delay, as will now be illustrated with reference to the timing chart of FIG. 26B. The circuit elements of FIG. 26A which are identical to those of FIG. 25A are indicated by the same reference numerals. The circuit of FIG. 26A is initially reset as was discussed above with reference to the circuit of FIG. 25A. If a "0" arrives at the A input of M520 with a pulse width less than the time constant $T=R1C1$ of the integrator 532, the circuit will perform as follows. The "0" at the A input of M520 will set it since its B input is a "0", as shown in rows I and II of FIG. 26B. The Q output of M520 will then be a "0" at time $t_o$, as shown in row III, and the capacitor 536 (C1) will begin to discharge from a "1" to a "0" through resistor 534 (R1) since the resistance of R1 is much smaller than the backward resistance of diode 538. When the discharge of capacitor C1 has proceeded to the point on the way to "0" where M528 will set, M528 sets providing a "1" at its $\overline{Q}$ output. This is shown at time $t_1$ of FIG. 26B. This "1" resets M520 and the Q output goes to a "1" which in turn charges C1 rapidly through the forward resistance $r_d$ of diode 538. This forward resistance is much smaller than the resistance of R1, and C1 charges rapidly to cause M528 to reset at time $t_2$. This is a one shot pulse generator with complementary outputs at the Q and $\overline{Q}$ outputs of M520.

Figure 27A:
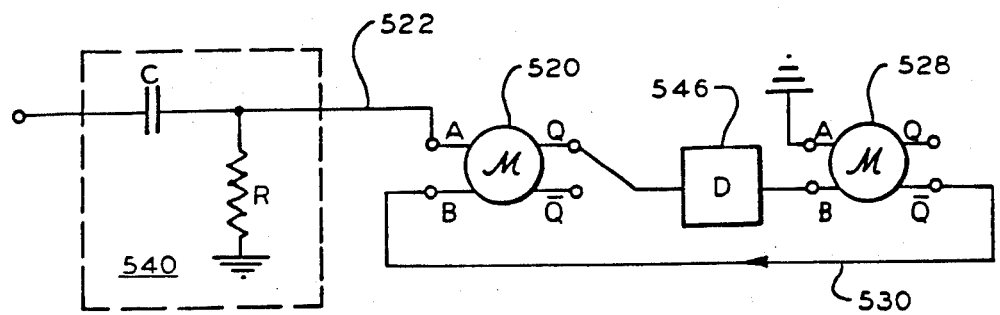
FIGS. 27A through 27D show various arrangements of M Circuits connected to provide one shot pulse generators.

In FIG. 27A, the circuit is the same as those in FIG. 25A and 26A above except that an RC differentiator 540 is provided in line 522 before the A input to M520. This differentiator 540 may be designed such that it will provide only enough energy at the input of M520 to set it. This unit of energy may be conveniently referred to as "one M energy unit". In general, the energy required to set any number n of M Circuits at the A inputs may be defined as "n M energy units". In this way, it is possible to separate the amount of energy in different input pulse by relating the pulses to the number of consecutive M Circuits which the pulses will set at the A input of a linear array of n M Circuits, such as of the type shown in FIG. 21 with all of the A inputs connected to a common input.

Figure 27B:
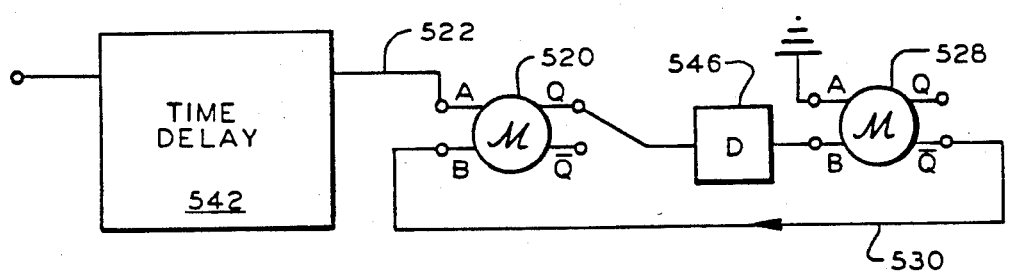

In FIG. 27B there is shown an M Circuit such as that of FIGS. 25A, 26A and 27A, except that a time delay means 542 is connected in line 522 connected to the A input of M520. In this arrangement, the momentary "0" on line 522 will be delayed a time equal to the time delay of circuit 542, before M520 is set. Thus, the pulse out of the one shot pulse generator is delayed. This circuit is a delayed one shot.

Figure 27C:
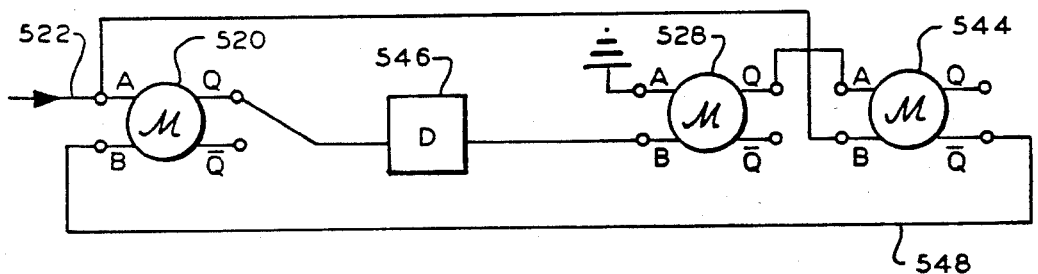

In FIG. 27C, there is shown another type of M Circuit, one shot pulse generator. This circuit is similar to those of FIGS. 25A and 26A above except that, here, the $\overline{Q}$ output of M528 is not fed back to the B input of M520. Instead, an additional M Circuit 544 of the type shown and described in FIG. 14B is included. In this arrangement, initially line 522 is at "1" and M520, M528 and M544 will be reset. A "0" on line 522 will now provide a single pulse out of M520 as long as this "0" is applied to the B input of M544 and M520 is held in reset via feedback line 548. Therefore, the circuit of FIG. 27C is a one shot, rather than the oscillator of FIG. 25A. This circuit is to be used where the "0" on line 522 will be longer than the time delay of delay means 546. This circuit, in conjunction with precise delay means 546 provides an excellent method of generating precise single pulses of a specific number of M energy units.

Figure 27D:
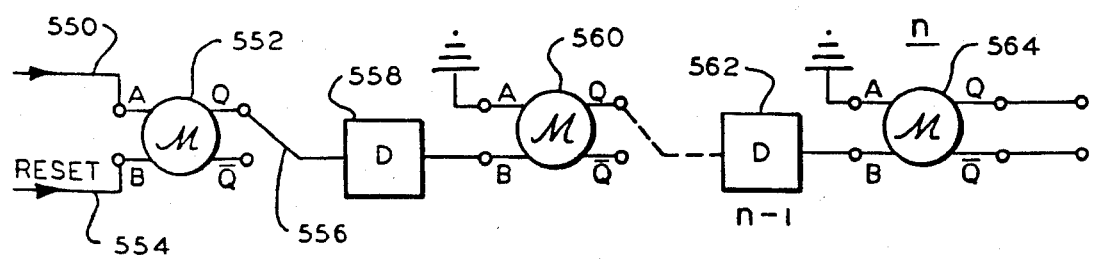

In FIG. 27D, there is shown a linear array of M Circuits. The A input of M552 is connected to line 550 which is normally "1". The B input is connected to an external reset line 554. The Q output of M552 is connected via line 556 to the input of a delay means 558, the output of which is connected to the B input of M560. The A input of M560 is placed at logic "0", shown here as a ground. In general, there will be a number n of M Circuits and a number n-1 of delay means 558 connected as M552, delay means 558, and M560, shown as delay means 562 and M564, respectively. The circuit will be initially reset by a momentary "1" at line 554 at the B input of M552 while the A input is a "1". In this circuit, a low on A input line 550 will appear at the output of M560 after the delay time of delay means 558 and, in general, at the output of the nth M Circuit after the delay time of delay means 552 plus the succeeding delay means up to the n-1 delay means 562. This is a form of M Circuit delay line.

LINEAR PULSE GENERATING AND WAVE SHAPING—N SHOTS

Figure 28:
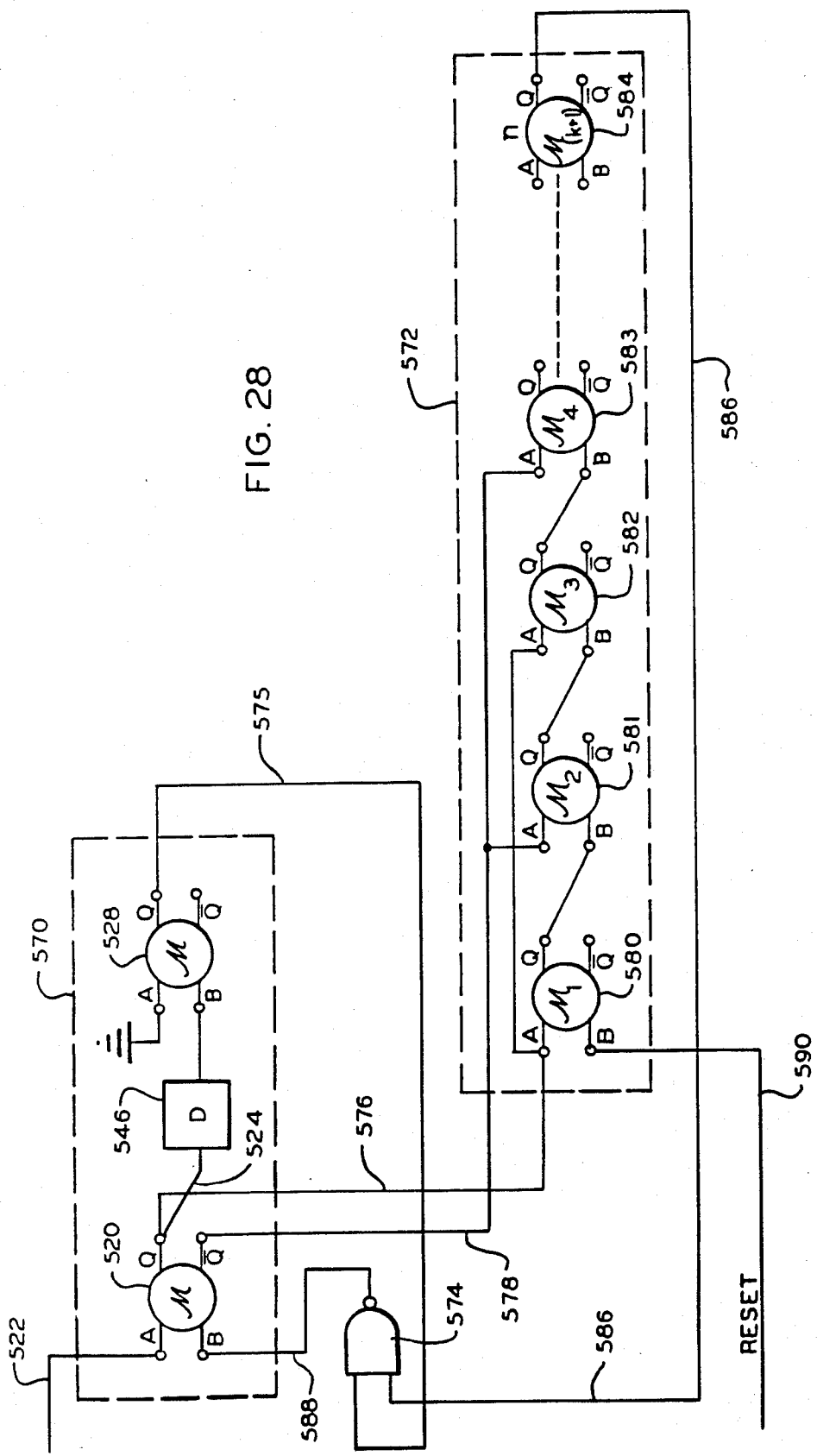
FIG. 28 shows an N shot pulse generating and wave shaping circuit formed of M Circuits.

A first form of M Circuit N shot is shown in FIG. 28. This comprises an M Circuit, oscillator or pulse generator 570 of the type shown in FIGS. 25A and 26A, and a linear array counter 572 of M Circuits of the general type shown in FIG. 21 including M Circuits M1 through M(k+1). Where the pulse generator 570 is identical to the pulse generator shown in FIGS. 25A and 26A, identical reference numerals 520, 522, 524 and 528 will be used to indicate the identical components. Also, the block indicated by numeral 546 is a delay means, described with reference to FIG. 27A.

The only difference is that a class 1 NAND gate 574 is provided in the feedback line 575 at the B input of M oscillator 570, the Q output of M520 of M Circuit oscillator 570 is connected via line 576 to the odd M Circuits of M Circuit counter 572 at their A inputs, and the $\overline{Q}$ output of M520 of M oscillator 572 is connected via line 578 to the even M Circuits of M Circuit counter 572.

The M oscillator 570 is assumed to be in reset, and the counter 572 is assumed to be in reset. Input line 522 will be high at "1". A "0" on line 522 will begin oscillations as described above. The timing chart of FIG. 25B may be referred to. The first "0" at the Q output of M520 will set M580, the first "0", after the reset of M520, at the $\overline{Q}$ output of M520 will set M581. This process will continue with M582, M583 and so on until the last or nth M Circuit M584 is set, at which time a "0" will appear at the counter 572 output on line 586 and be applied to the class 1 gate 574. This "0" at the input of gate 574 will provide a "1" on line 588 to the B input of M520 thereby forming M520 to reset, if it is not then reset. Thus, by selecting the length of counter chain 572, the number of pulses out of M Circuit oscillator 570 is determined. An external reset line 590 is connected to the counter 572 for resetting the same.

Figure 29:
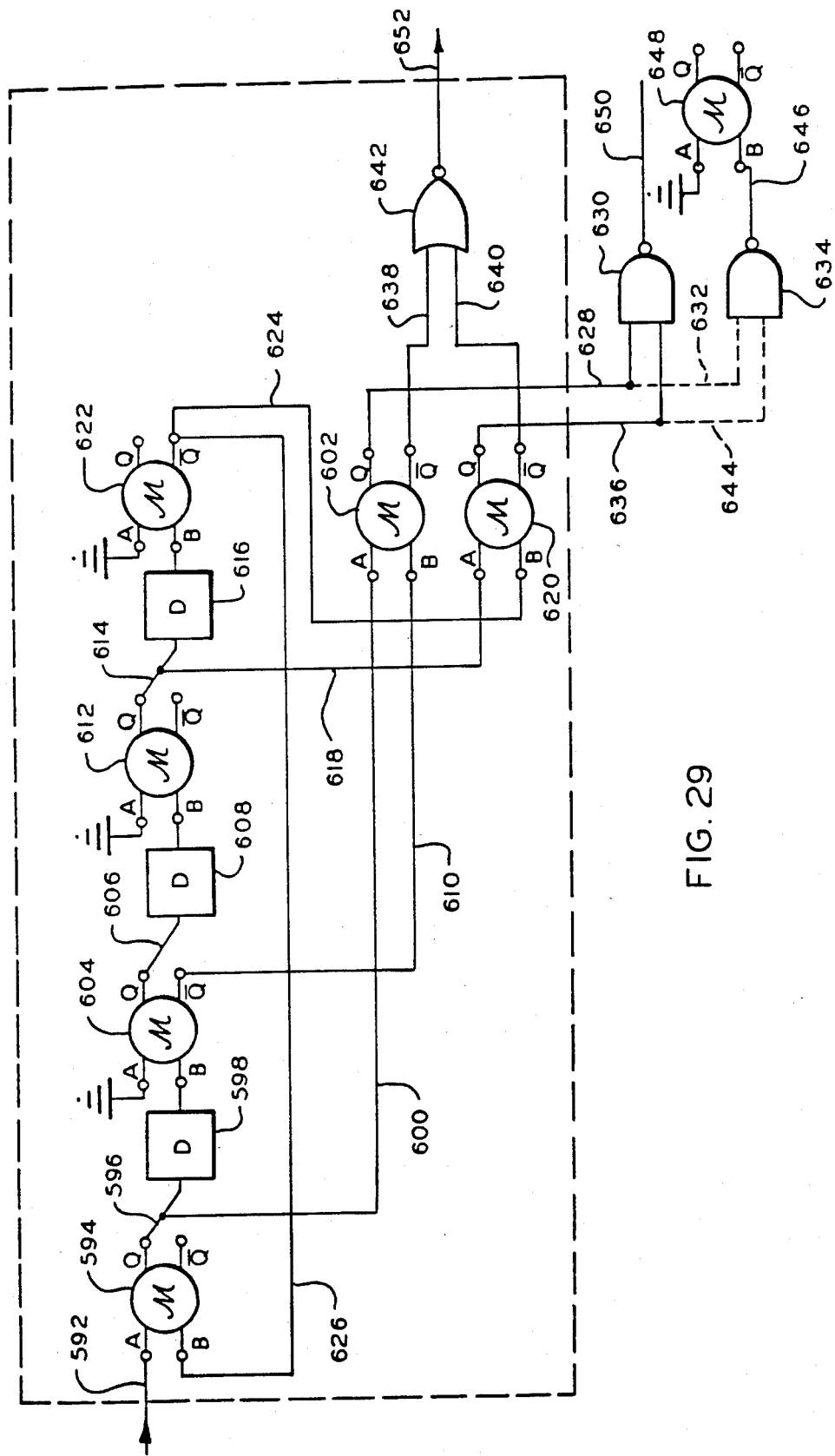
FIG. 29 shows a two shot pulse generator formed of M Circuits.

A second form of M Circuit N shot is shown in FIG. 29, as specifically a two shot configuration. Here, input line 592 is connected to the A input of M594. The Q output of M594 is connected via line 596 to the input of delay means 598 and via line 600 to the A input of M602. The output of delay means 598 is connected to the B input of M604. The A input of M604 is connected to logic "0" shown here as ground. The Q output of M604 is connected via line 606 to the input of a delay means 608 and the $\overline{Q}$ output of M604 is connected to the B input of M602. The output of delay means 608 is connected to the B input of M612 and the A input of M612 is connected to logic "0", as was the A input of M604. The Q output of M612 is connected via line 614 to one input of delay means 616 and also connected via line 618 to the A input of M620. The output of delay means 616 is connected to the B input of M622 and the A input of M622 is connected to logic "0" as was the A input of M612. The $\overline{Q}$ output of M622 is connected via line 624 to the B input of M620, and via line 626 to the B input of M594.

The Q output of M602 is connected via line 628 to one input to class 1 NAND gate 630 and, alternatively, as shown by dotted line 632, to one input of class 1 NAND gate 634. The other input to gate 630 is received on line 636 from the Q output of M620. The $\overline{Q}$ output of M602 and the $\overline{Q}$ output of M620 are provided, respectively, by lines 638 and 640, as first and second inputs to class 1 NOR gate 642. In the alternate connection shown by line 644, the Q output of M620 is connected as the other input to gate 634. The output of gate 634 is connected via line 646 to the B input of M648. The A input of M648 is connected to logic "0" shown as a ground connection.

The system of FIG. 29 will initially be reset, i.e., all M Circuits are reset except M648. Input line 592 will be a "1" initially. Next, assume a momentary "0" occurs on line 592. M594 will set and then M602 will set. This is true because the B input of M594 is a "0" since M622 is reset and the B input of M602 is "0" since M604 is reset. This setting of M602 will provide a "0" via line 628 at the upper input of gate 630 which in turn will output a "1" on line 650. Also, the setting of M602 provides a "1" on line 638 to the input of gate 642 which will output a "0" on line 652. In the alternate connection on line 632, the "0" at the Q output of M602 will cause gate 634 to output a "1" on line 646 and reset M648, thereby providing a "1" at its Q output and a "0" at its $\overline{Q}$ output.

At the end of the time delay of delay means 598, the "0" at the Q output of M594 will arrive at the B input of M604 and cause it to set. This will provide a "0" at the Q output of M604 and a "1" at the $\overline{Q}$ output of M604. This "1" at the $\overline{Q}$ output of M604 will reset M602 via line 610. The Q output of M602 will thus be a "1" at this time, and since both inputs to gate 630 are now at "1", the output of gate 630 will go to "0". The $\overline{Q}$ output of M602 will be a "0+" at this time and since both inputs to gate 642 are at "0", the output of gate 642 will go to "1" at this time. In the alternate connection on line 632, the "1" at the Q output of M602 will similarly cause gate 634 to output a "0", thereby setting M648 so that its Q output will go to "0" and is $\overline{Q}$ output will go to "1" at this time. Thus, at the end of the time delay of delay means 598, a single positive pulse of time width equal to the delay of delay means 598 is provided at the output line 650 of gate 630, a negative pulse is provided at the output line 652 of gate 642, and in the alternate connection, M648 has provided a positive pulse at its Q output and a negative pulse at its $\overline{Q}$ output.

With M602 now reset, the "0" at the Q output of M604 will arrive at the B input of M612 after the time delay of delay means 608, and M612 will set. This will provide a similar action coactively with M620, gate 630, gate 642, gate 634 and M648 as described above with reference to M594 and M602. The setting of M622 occurs after the time delay of delay means 616 and will reset M620 via line 624. When M620 is reset, a "1" on line 636 provides a "0" at the B input of M648 to set it, and a second pulse will have been generated by M648. The setting of M622 will reset M594, M604, M612 and M622 itself, as described above. Thus, two pulses have been generated in response to a momentary "0" on line 592.

It should be obvious that the system of FIG. 29 may be expanded indefinitely to create any number of desired output pulses. It may also be noted that the delay means may be varied to provide any desired pulse widths as well as intervals between pulses. Also, it is to be pointed out that, an indefinite number of serial, and serial and parallel pulse trains may be generated of any type desired through the use of class 1 and class 2 type NAND and NOR gates, the use of additional M Circuits, such as M602, M620 and M648, and by connecting the B input of M Circuits such as M602 and M620 to different or other $\overline{Q}$ outputs along the linear array, always insuring that M Circuits of the type M602 or M620 will reset.

WAVE GENERATING, SHAPING AND TEST SYSTEMS

Figure 30:
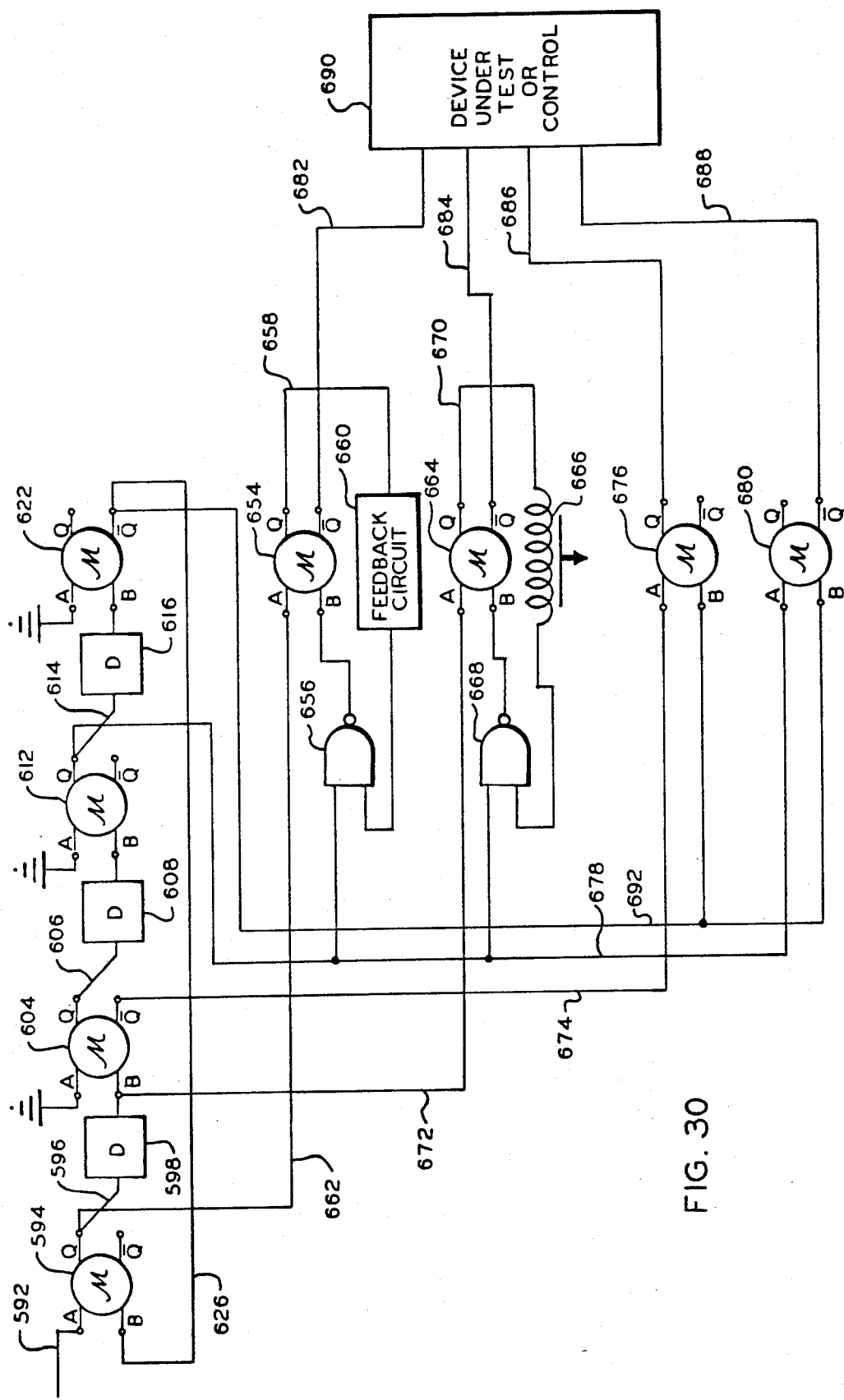
FIG. 30 shows a control system formed of an N shot pulse generator of the type shown in FIG. 29.

In FIG. 30, there is shown an example of the use of an M Circuit N shot of the type described in FIG. 29. Here, the N shot circuit is employed as a controller for a wave form generation and testing system or a control system. The results of the testing may be interpreted directly by planar arrays of M Circuits to be described below, or fed to input systems, also to be described below, prior to interpretation by arrays of M Circuit systems.

The connection and operation of M Circuits M594, M604, M612 and M622 and delay means 598, 608 and 616 has been described above, with identical reference numerals used to indicate identical elements.

M Circuit 654 is connected as a wave shaping circuit of the type shown in FIG. 10E. The difference here is that a class 1 NAND gate 656 is provided at the B input of M654 with the Q output of M654 connected via line 658 to the input of a feedback circuit 660, instead of connecting the $\overline{Q}$ output as shown in FIG. 10E. Also, the A input of M654 is connected via line 662 to the Q output of M594. M Circuit 664 is similar to the delay line oscillator shown in FIG. 10D and includes a delay line 666 and a class 1 NAND gate 668 connected with the feedback line 670 from the Q output of M664. The B input to M604 is connected via line 672 to the A input of M664. The $\overline{Q}$ output of M604 is connecte via line 674 to the A input to M676. The Q output of M612 is connected via line 678 as an input to gates 656 and 668, and to the A input of M680. Generally, M654 provides various wave shapes, M664 provides various oscillating functions, and M676 and M680 provide various parallel pulse trains via the output lines 682, 684, 686 and 688, respectively, to a device 690 under test or control.

When line 592 goes to "0", M594 will set and M654 will be set from that time until the end of the combined delay times of delay means 598 and 604 so as to provide desired wave shape or shapes to the device 690. In a similar manner, M664 will be oscillating from the end of the delay time of delay means 598 until the end of the delay time of delay means 608, thereby providing a signal on output line 684 to device 690 during this time interval. M676 will provide a pulse to device 690 starting from the end of the delay time of delay means 598 to the end of delay time of delay means 616 as controlled by input lines 674 and 692. Also, M680 provides a pulse to device 690 starting from the end of the delay of delay means 608 to the end of the delay of delay means 616, as controlled by lines 678 and 692.

Figure 31:
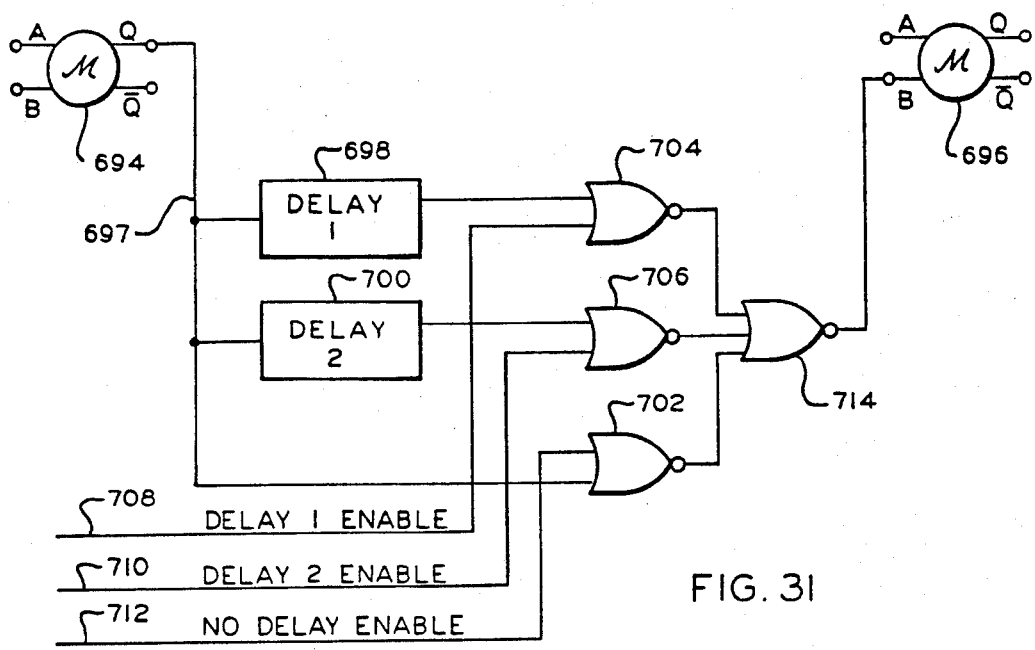
FIG. 31 shows a variable delay circuit used in an M Circuit system.

Referring to FIG. 31, there is shown a method of varying the delays, or in general the feedback circuits in M Circuit systems. A variable circuit is connected between the Q output of M694 and the B input of M696. The Q output of M694 is connected via line 697 to the inputs of time delay means 698 and 700, and also to one input to a class 2 NOR gate 702. The outputs of delay means 698 and 700 are connected to one input of class 2 NOR gates 704 and 706, respectively. The other inputs to gates 704, 706 and 702 are provided on input lines 708, 710 and 712, shown as DELAY 1 ENABLE, DELAY 2 ENABLE and NO DELAY ENABLE, respectively. The outputs of gates 702, 704 and 706 are connected as inputs to a class 1 NOR gate 714. The output of gate 714 is connected via line 716 to the B input of M696.

Normally, the Q output of M694 is "1", the B input of M696 is "1" and one and only one of lines 708, 710 and 712 is "0". Assume the DELAY 2 ENABLE line 710 is a "0". When M694 sets, its Q output is "0". This "0" is applied at the input of gate 702 but will not appear at the output of such gate 702 as a data change because of the absence of an enable on line 712, and the output of gate 702 will remain a "0". If DELAY 2 is longer than DELAY 1, when the "0" at the Q output of M694 arrives at the input of gate 704 through delay means 698, the output of gate 704 will not change, because of the absence of an enable on line 708. However, when the output of delay 700 goes to "0", gate 706 will output a "1" since line 710 is "0". This "1" will appear as a "0" at the output of gate 714 and M696 will have a "0" at its B input. A similar operation occurs if line 708, or line 712 is a "0". Circuits of this type are useful especially when used in conjunction with self adapt and learn systems to be described below.

Figure 32:
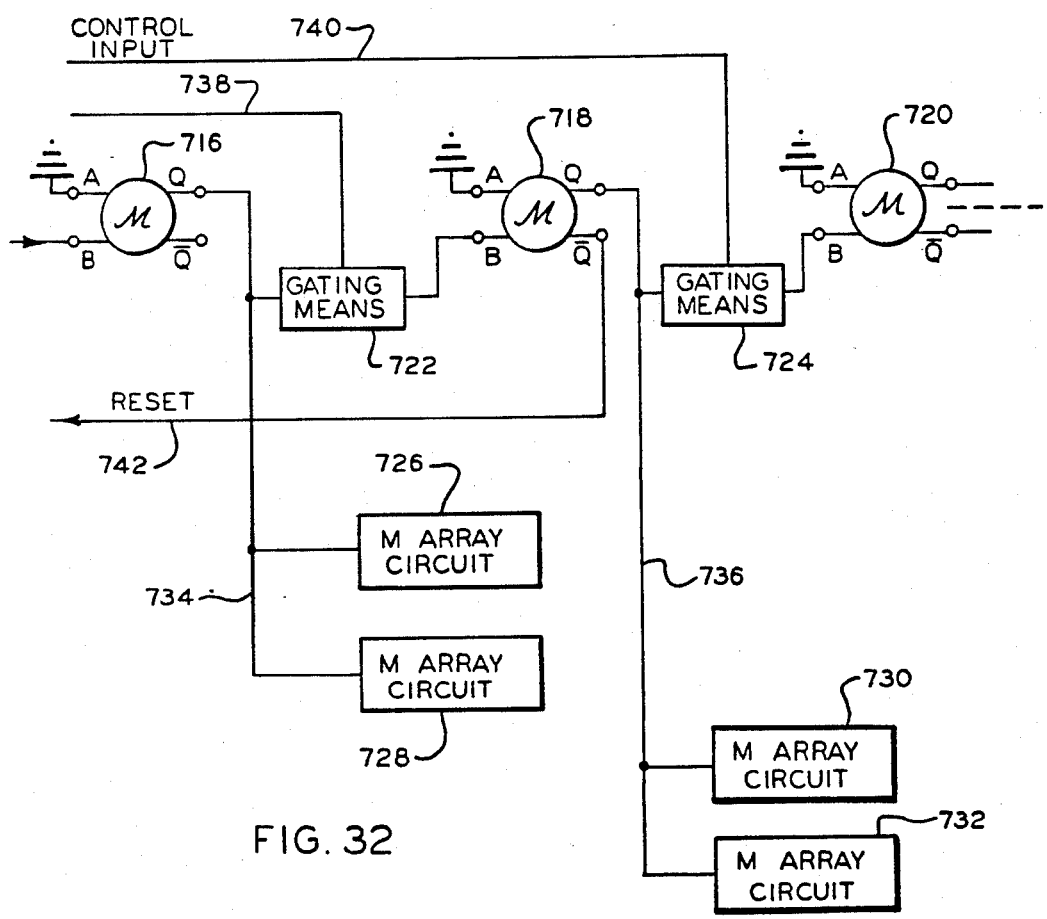
FIG. 32 shows a general arrangement of an M Circuit pulse generating and wave shaping system.

In FIG. 32 there is shown a more general arrangement of an M Circuit pulse generating and wave shaping system. M Circuits 716, 718 and 720 are connected in a delay line fashion as shown and described with reference to FIG. 27D. Gating means 722 and 724 generally comprise a circuit of the type shown in FIG. 31. M array circuits 726, 728, 730 and 732 are of the general type shown in FIG. 30 wherein the input lines 734 and 736 from the Q outputs of M716 and M718, respectively, correspond with the input line 592 of FIG. 30. Also, control input lines 738 and 740 of FIG. 32 correspond with the enable lines 708, 710 and 712 of FIG. 31. Gating means 722 and 724 are connected between the Q outputs of M716 and M718 and the B inputs of M718 and M720, as shown. The B input of M718 provides a reset on line 742.

In operation, at some time, M716 will set and gating means 722 and M arrays 726 and 728 will be enabled on line 734. The M array circuits 726 and 728 will generate a series of serial or parallel pulses or provide a combination of pulses and wave shapes in various arrangements, as described with reference to FIG. 30.

When the output of gating means 722 becomes a "0", M716 will set and provide a "0" at the input of gating means 724 and M array circuits 730 and 732. At this time, M array circuits 730 and 732 will begin to generate wave forms and pulses. These wave forms and pulses generated in M730 and 732 may exist simultaneously with M arrays 726 and 728, or either or both of M array circuits 726 and 728 may have completed their cycle and be in reset at this time. The $\overline{Q}$ output of M718, or any other M circuit in the system, may be fed back to reset some other portion of the system as described above. In this manner, pulse generating and wave shaping systems of simplicity with wide application and flexibility are provided.

Although the above description is directed to the preferred embodiments of the invention, it is noted that other variations and modifications will be apparent to those skilled in the art and, therefore, may be made without departing from the spirit and scope of the present disclosure.

What is claimed is:

1. A logic system which includes a plurality of identical logic circuit building blocks, each referred to as an M Circuit, said M Circuits being connected in a linear array of interconnected M Circuits including first through last M Circuits, said linear array providing a latch operation, said system comprising:

a plurality of M Circuits each of which responds to transitions of a two level binary input signal to provide a memory and a logic function which has a complete truth table for every possible combination of input signal transitions or changes in logic level at a pair of input terminals A and B, each of said M Circuits comprising gating means having two inputs connected to said A and B input terminals, respectively, and a set-reset flip flop means having its set input connected to the output of said gating means, its reset input connected to said B input terminal and its set and reset outputs connected respectively to output terminals Q and $\overline{Q}$ of said M Circuit, said Q and $\overline{Q}$ output terminals providing complementary binary output for any combination of binary inputs applied to said A and B input terminals, whereby said M Circuit is a four terminal device which responds to each transition of said input signal at said A and B terminals to provide outputs at said Q and $\overline{Q}$ terminals in accordance with its truth table function; and means connecting one of said output terminals of each of the first through next to last M Circuits to the B input terminal of the succeeding M Circuit; means coupling the A input terminals of said M Circuits together, said A input terminals being coupled to a source of an input signal; and means connecting one of said output terminals of the last M Circuit as a reset line to the B input terminal of the first M Circuit; whereby one of said output terminals of said first M Circuit may be provided as a latch output line for operating an output device in response to said input signal.

2. The logic system recited in claim 1, wherein said means connecting the A input terminals of said M Circuits together comprises a further M Circuit.

3. The logic system recited in claim 2, wherein said linear array of M Circuits comprises a group of odd numbered M Circuits and a group of even numbered M Circuits and wherein said source of an input signal is coupled to the B input terminal of said further M Circuit, the Q output terminal of said further M Circuit coupled to the A input terminal of even numbered M Circuits in the linear array, the $\overline{Q}$ output terminal coupled to the A input terminal of the odd numbered M Circuits in the linear array.

* * * * *